US012417816B2

(12) United States Patent
Fu et al.

(10) Patent No.: US 12,417,816 B2
(45) Date of Patent: Sep. 16, 2025

(54) MEMORY TESTING FLOW SET UP WITH COMPUTATIONAL INTELLIGENCE

(71) Applicant: Sandisk Technologies, Inc., Milpitas, CA (US)

(72) Inventors: Cuili Fu, Shanghai (CN); Chengxue Huo, Shanghai (CN); Xiaohu Liu, Shanghai (CN); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 48 days.

(21) Appl. No.: 18/461,237

(22) Filed: Sep. 5, 2023

(65) Prior Publication Data

US 2025/0078951 A1 Mar. 6, 2025

(51) Int. Cl.
G11C 29/56 (2006.01)
(52) U.S. Cl.
CPC .............. G11C 29/56008 (2013.01)
(58) Field of Classification Search
CPC .............................................. G11C 29/56008
See application file for complete search history.

(56) References Cited

U.S. PATENT DOCUMENTS

| | | | |
|---|---|---|---|
| 6,907,378 B2 * | 6/2005 | Stirrat | G01R 31/31835 700/121 |
| 8,006,156 B2 | 8/2011 | Kojima | |
| 11,346,882 B2 | 5/2022 | Fonseca et al. | |
| 2003/0025904 A1 * | 2/2003 | Sakai | G01N 21/94 356/237.2 |
| 2005/0052643 A1 * | 3/2005 | Lange | G01N 21/9501 356/237.1 |
| 2008/0270056 A1 | 10/2008 | Yang et al. | |
| 2009/0157340 A1 | 6/2009 | Gopalan et al. | |
| 2014/0072203 A1 * | 3/2014 | Wu | G01N 21/9501 382/149 |

OTHER PUBLICATIONS

Arnold, Naomi, "Wafer Defect Prediction with Statistical Machine Learning," Massachusetts Institute of Technology, Jun. 2016, 83 pages.
Wang, Weiqiang, et al., "Qualification for Product Development," International Conference on Electronic Packaging Technology & High Density Packaging, Jul. 2008, 12 pages.

* cited by examiner

Primary Examiner — Guerrier Merant
Assistant Examiner — Jack Kensington Barnett
(74) Attorney, Agent, or Firm — Pearl Cohen Zedek Latzer Baratz LLP

(57) ABSTRACT

Technology for determining a test flow for testing memory during a production phase. The following are accessed: a list of test items with a number of candidate test item conditions for each test item, defects (e.g., bad blocks) detected by each test item condition, a list of benchmark defects (e.g., bad blocks), and judgement criteria. The defects (e.g., bad blocks) for the candidate test item conditions may be compared with the benchmark defects (e.g., bad blocks) in view of judgement criteria. Based on the comparison, at least one test item may be eliminated resulting in a set of remaining test items. A production phase test flow having a test item condition for each remaining test item may be generated.

18 Claims, 26 Drawing Sheets

1. Judgement criteria

Screen ZZ: The screen condition whose yield loss >max ( ☐%, cycling yield loss*☐ )
Screen 01...n: The screen condition has least extra yield loss per 1K DPPM improve
Screen A01...An: Other condition of screen 01
Screen F01...Fn: The screen condition whose
      ○ catch ratio ≤ ☐%
      ○ catch ratio = 0
Screen X01...Xn: The screen condition whose DPPM improve≤ ☐

2. Incoming BB list of all test die [_____] ...
3. All candidate test item conditions [_____] ...
4. All candidate test item conditions BB list [_____] ...
5. Cycling BB list [_____] ...

| Lot ID | Wafer | Die x | Die y | Plane | Incoming BB |
|---|---|---|---|---|---|
| ABC123456 | 9 | 26 | 5 | 0 | 16, 692, 2004 |
| ABC123456 | 9 | 26 | 5 | 1 | ... |
| ... | ... | ... | ... | ... | ... |

| Test Item | Candidate Condition | Item detail | Condition detail |
|---|---|---|---|
| 1 | 1 | User input, can be empty | User input, can be empty |
| 1 | 2 | User input, can be empty | User input, can be empty |
| ... | ... | User input, can be empty | User input, can be empty |

| Test Item (1910) | Condition (1920) | Item detail (1930) | Condition detail (1940) |
|---|---|---|---|
| 1 | 2 | User input, can be empty | User input, can be empty |
| 3 | 5 | User input, can be empty | User input, can be empty |
| ... | ... | User input, can be empty | User input, can be empty |

| DPPM (2010) | Yield Loss (2020) |
|---|---|
| 10,309 | 3% |

| Test Item (2110) | Candidate Condition (2120) | Item detail (2130) | Condition detail (2140) | Screen (2150) |
|---|---|---|---|---|
| 1 | 1 | User input, can be empty | User input, can be empty | Screen ZZ |
| 1 | 2 | User input, can be empty | User input, can be empty | Screen 02 |
| ... | ... | User input, can be empty | User input, can be empty | ... |

Figure 24
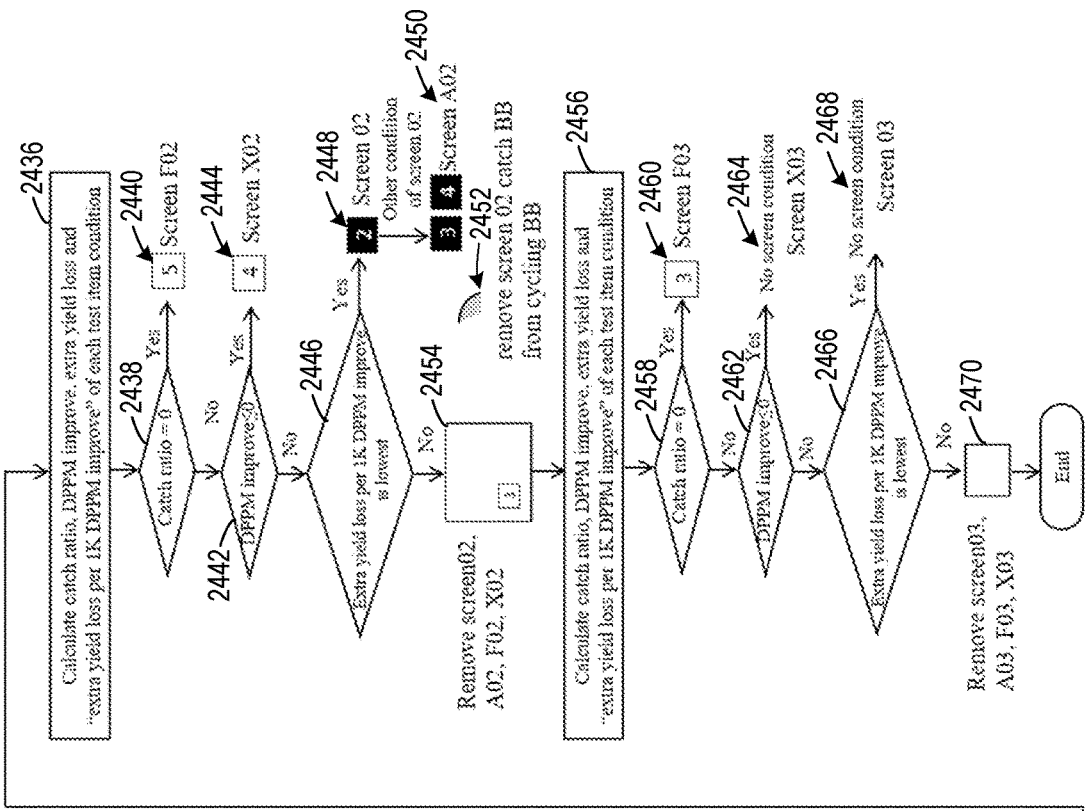
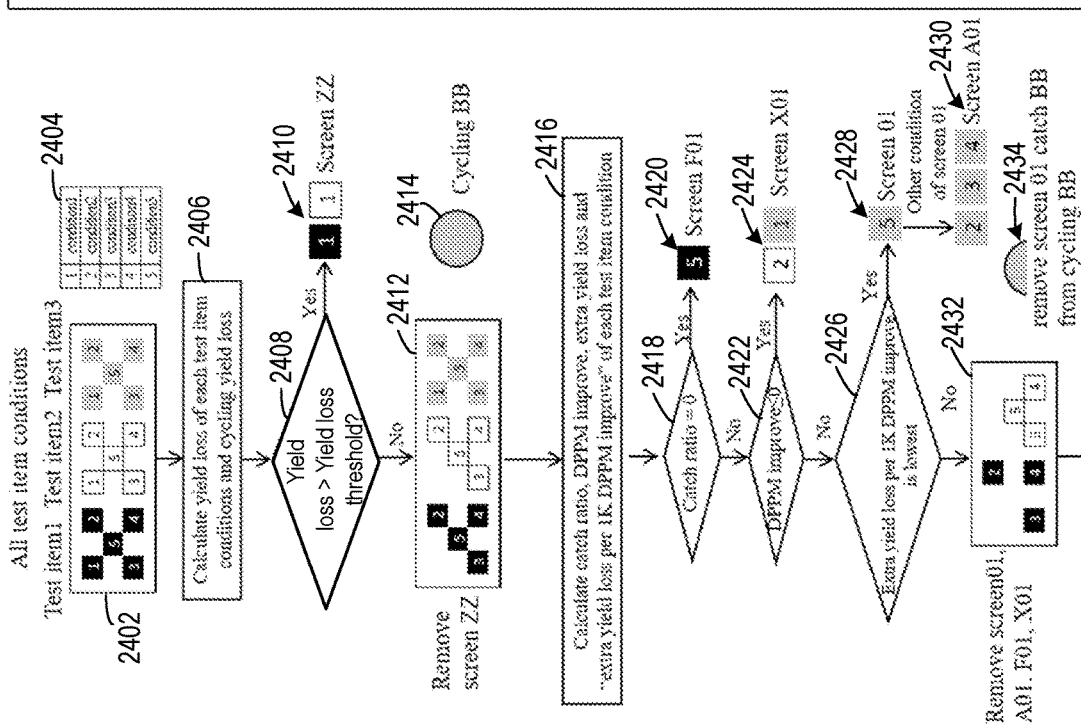

MEMORY TESTING FLOW SET UP WITH COMPUTATIONAL INTELLIGENCE

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

A memory structure in the memory system typically contains many memory cells and various control lines. The memory structure may be arranged into units that are referred to as blocks. For example, a block in a NAND memory system contains many NAND strings. A NAND string contains memory cell transistors connected in series, a drain side select gate at one end, and a source side select gate at the other end. Each select gate may have one or more transistors in series. Each NAND string is associated with a bit line. The block typically has many word lines that provide voltages to the control gates of the memory cell transistors. In some architectures, each word line connects to the control gate of one memory cell on each respective NAND string in the block. Other types of memory such as magnetoresistive memory (e.g., MRAM, Spin Transfer Torque MRAM, Spin Orbit Torque MRAM), FeRAM, and phase change memory (e.g., PCM) also exist.

Development typically includes a development and qualification phase that precedes the production phase. One of the goals of these phases is to meet defective part count goals such as defective parts per million (DPPM). During the production phase, testing will be performed to screen out defective parts. Parts that are identified as defective by memory tests during factory testing could be marked as bad (e.g., bad block) or discarded (e.g., bad die). Moreover, it is desirable that the factory tests are able to detect parts that will not meet a usage criterion. However, some parts that eventually fail to meet a usage criterion could still be shipped to the customer because they are not detected as a defective part during factory testing. A part that does not meet such usage criterion may be defined as a defective part. For NAND memory dice, a usage criterion may be defined as meeting a number of program/erase cycles, but other usage criteria could be used.

The development and qualification phase may be used to develop test items to screen out defects such as bad blocks (BB) or bad die. Examples of test items are leakage current (e.g., word line leakage, bit line leakage, etc.), word line RC, fail bit count. The condition may be some parameter or value that demarcate a pass/fail status. For example, for leakage current the condition may be a current magnitude, for fail bit count the condition may be a number of fail bits per unit of data. A goal of the test items in the production phase is to screen out most, if not all, of the defective parts.

The production phase may include a number of test items with a condition for each test item. Herein, the term "test item condition" may be used to refer to one of the conditions of a test item. If the test item conditions used at the production phase fail to detect defect parts then the DPPM of parts shipped to the customer may be too high. However, some test item conditions may have overkill, which means that the test item condition will identify a defect that does not result in defect in the part shipped to the customer. Such test item conditions may induce yield loss by making block or even dies as bad.

Identifying the best test item conditions for inclusion in the production phase test flow is technically challenging. There may be many test items with each test item having many candidate conditions. For example, there could be about 500 test items, with each test item having about 20 candidate conditions. Therefore, for example, there may be about $20^{500}$ test combinations. The problem is how to find best combination of test item conditions to meet DPPM target, minimize yield loss, save time and cost in memory tests.

BRIEF DESCRIPTION OF THE DRAWINGS

Like-numbered elements refer to common components in the different figures.

FIG. 14 is an embodiment of a user interface that may be presented in a display screen to allow the user to enter input for determining a production test flow.

FIG. 15 depicts a table of incoming bad blocks.

FIG. 16 depicts a table of candidate test item conditions.

FIG. 19 depicts a table of the test flow output by an embodiment of an application that determines the production test flow.

FIG. 20 depicts a table that shows estimated DPPM and estimated yield loss for the production test flow.

FIG. 21 depicts a table that shows what category caused the elimination of candidate test item conditions.

FIG. 24 is a flowchart of a detailed example of process of determining a production test flow for testing memory dice.

DETAILED DESCRIPTION

Technology is disclosed herein for determining a test flow for testing memory during a production phase. One embodiment includes a computer implemented method for determining a test flow for testing memory dice during a production phase. The test flow includes a number of test item conditions. In an embodiment, a user interface is provided in order to receive input to determine the production phase test flow. The user interface may receive a list of test items with a number of candidate test item conditions for each test item, defects (e.g., bad blocks) detected by each test item condition, a list of benchmark defects (e.g., bad blocks), and judgement criteria. The test items are tests performed on memory dice having memory cells to determine defects, such as bad blocks. The candidate test item conditions for each respective test item are candidate pass/fail criteria for the respective test item. The benchmark defects (e.g., bad blocks) are a goal of the test item conditions to catch or detect. The benchmark defects may be usage defects that are associated with typical customer usage. However, the test item conditions should not identify defects (e.g., bad blocks) that are not benchmark defects (e.g., bad blocks), as that could increase yield loss. The defects (e.g., bad blocks) for the candidate test item conditions may be compared with the benchmark defects (e.g., bad blocks) in view of judgement criteria. The judgement criteria may serve as a way to evaluate the effectiveness of the candidate test item conditions. For example, the judgement criteria may be related to yield loss, catch ratio, defective part improvement, etc. Based on the comparison, at least one test item may be eliminated resulting in a set of remaining test items. A production phase test flow having a test item condition for each remaining test item may be generated.

Eliminating at least one of the test items has a number of technical benefits. Some of the test items may be ineffective at catching defects (e.g., bad blocks) regardless of what condition is selected for the test item. Including such ineffective test items may increase yield loss due to, for example, incorrectly identifying bad blocks. For example, the ineffective test item may identify a block as being bad that is not on the list of benchmark defects (e.g., bad blocks). Therefore, eliminating at least one of the test items may reduce yield loss in the production phase. However, failing to include an effective test item in the production test flow could increase DPPM by, for example, failing to detect a defect (e.g., bad block). Therefore, including effective test items keeps the DPPM low in the production phase. Moreover, eliminating at least one of the test items in the production phase reduces test time, therefore saving time and cost.

Figure 1:
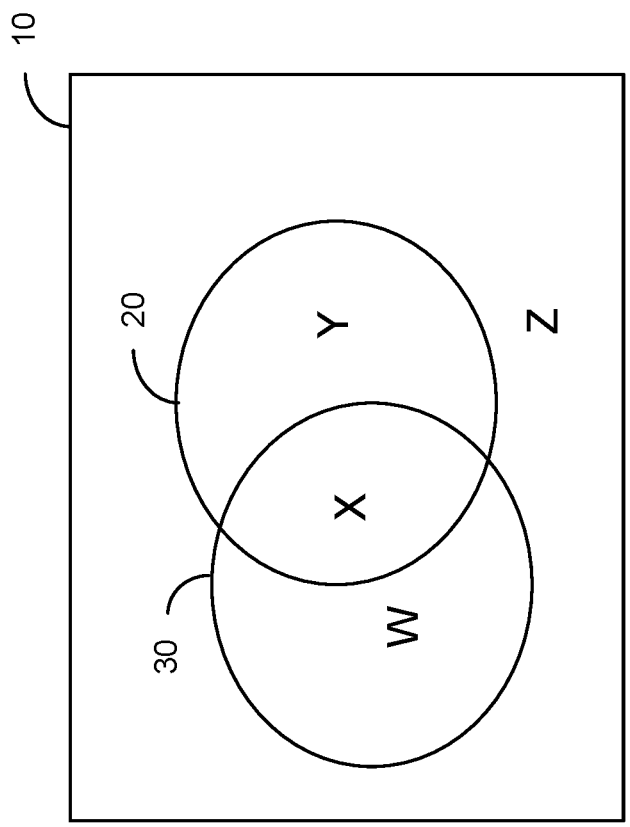
FIG. 1 is a diagram that illustrates relationships between cycling fail blocks and test item fail blocks.

FIG. 1 is a diagram that illustrates relationships between cycling fail blocks and test item fail blocks. Rectangle 10 represents all blocks that are tested on a die. Oval 20 represents the cycling fail blocks of the tested die. A cycling fail block is a block that failed a cycling test. The cycling test may be used to mimic customer usage such that cycling test can identify parts that will not meet such usage criterion such as, for example, a number of program/erase cycles. Other tests such as stress tests could be used to identify parts do not meet a usage criterion. Blocks that pass the cycling tests are referred to as cycling pass blocks. Oval 30 represents the test item fail blocks. A test item fail block is a block that was identified as failing a condition of the test item. The catch ratio may be defined as the X/(X+Y). Thus, the catch ratio are blocks caught by a test item and also caught by cycling. The overkill rate may be defined as W/(W+X). Thus, the overkill rate may be defined as ratio of the false block detections of the test items to the total bad block detections of the test items. The block fail rate may be defined as (W+X)/(W+X+Y+Z). Thus, the block fail rate may be defined as the ratio of the total blocks caught by the test items to the total blocks tested. The yield loss may be defined as a die with a number of bad blocks that exceed a bad block per plane criterion.

Figure 2A:
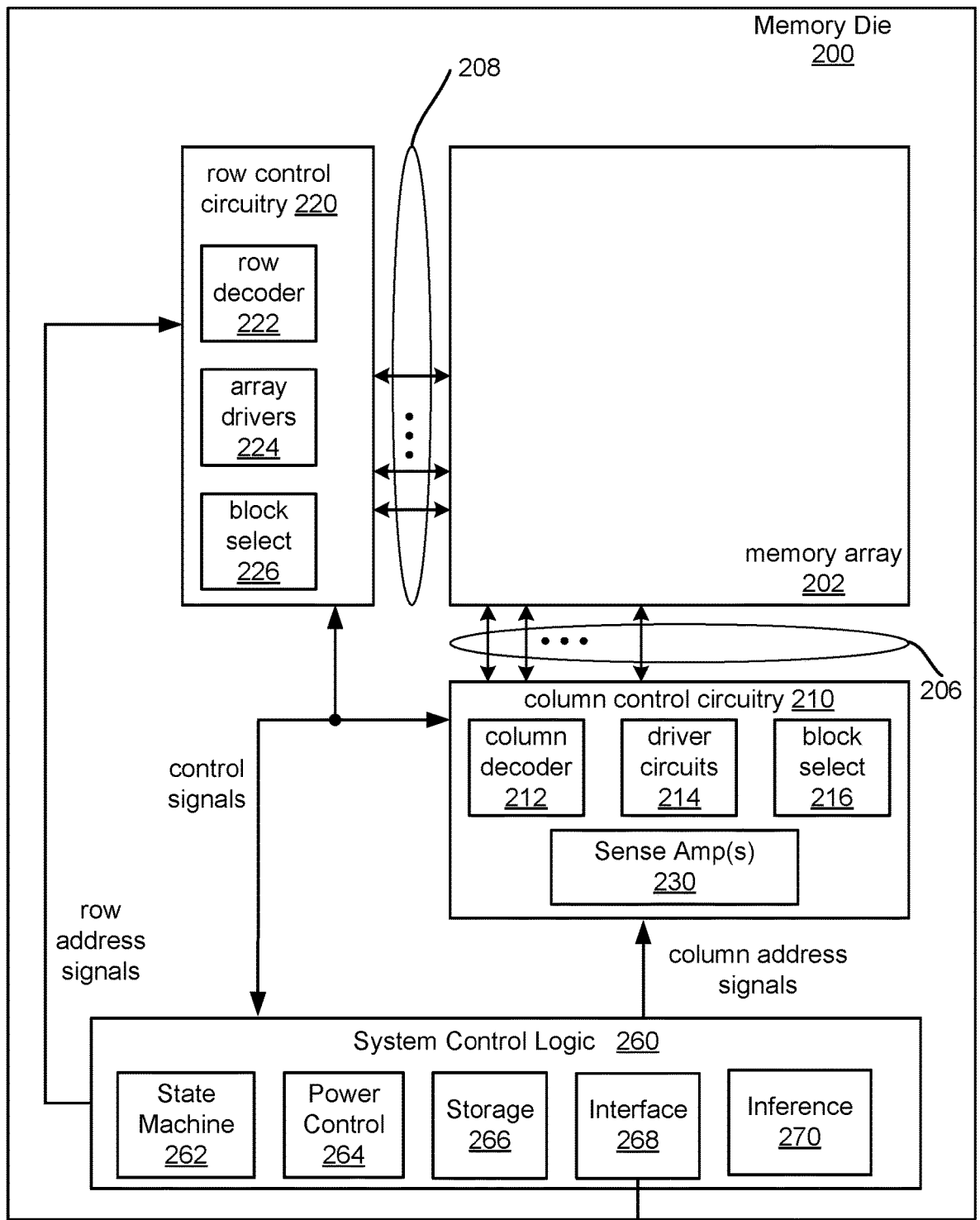
FIG. 2A is a block diagram of one embodiment of a memory die.

A method, system, and computer readable medium are disclosed for determining a test flow for testing memory during a production phase. In an embodiment, a flow for testing memory dice is determined. FIG. 2A is a functional block diagram of a memory die 200.

The components depicted in FIG. 2A are electrical circuits. Memory die 200 includes a non-volatile memory array 202 (which is one example of a non-volatile memory structure) that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from a memory controller and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory array 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between a memory controller and memory die 200 via memory controller interface 268 (also referred to as a "communication interface"). Memory controller interface 268 is an electrical interface for communicating with the memory controller. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory array 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory array 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory technology is required for purposes of the new claimed embodiments proposed herein. Other examples of suitable technologies for memory cells of the memory array/structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory array 202 and (2) peripheral circuitry, where peripheral circuitry includes all of the components depicted in FIG. 2A other than memory array 202. An important characteristic of a memory circuit is its capacity, which can be increased by increasing the area of the memory die of a storage system that is given over to the memory array 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system is the amount of area to devote to the memory array 202 and the amount of area to devote to the peripheral circuitry.

Another area in which the memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
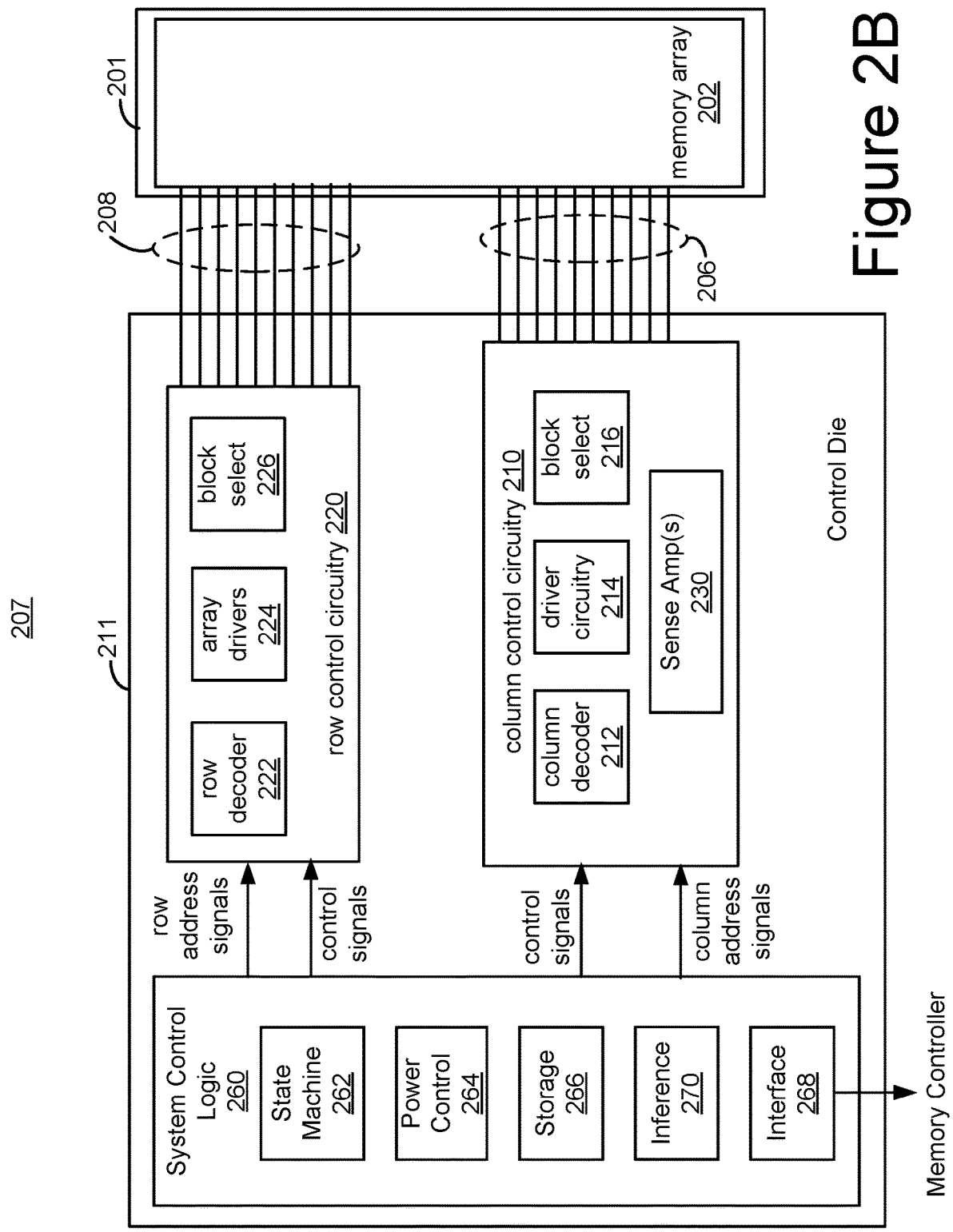
FIG. 2B is a block diagram of one embodiment of an integrated memory assembly.

FIG. 2B shows an alternative arrangement to that of FIG. 2A which may be implemented using wafer-to-wafer bonding to provide a bonded die pair comprising a memory die and a control die. In that regard, FIG. 2B is a functional block diagram of integrated memory assembly 207, which is another embodiment of a memory die assembly. The components depicted in FIG. 2B are electrical circuits. The integrated memory assembly 207 includes two types of semiconductor die (or more succinctly, "die"). Memory die 201 includes memory array 202. Memory array 202 includes non-volatile memory cells. Control die 211 includes control circuitry 260, 210, and 220 (as described above). In some embodiments, control die 211 is configured to connect to the memory array 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory array 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller may require few or no additional process steps (i.e., the same process steps used to fabricate controller may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory array 202 on the memory die 201 through electrical paths 206. For example, electrical paths 206 may provide electrical connection between column decoder 212, driver circuitry 214, and block select 216 and bit lines of memory array 202. Electrical paths may extend from column control circuitry 210 in control die 211 through pads on control die 211 that are bonded to corresponding pads of the memory die 201, which are connected to bit lines of memory array 202. Each bit line of memory array 202 may have a corresponding electrical path in electrical paths 206, including a pair of bond pads, which connects to column control circuitry 210. Similarly, row control circuitry 220, including row decoder 222, array drivers 224, and block select 226 are coupled to memory array 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of state machine 262, all or a portion of system control logic 260 (all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3A:
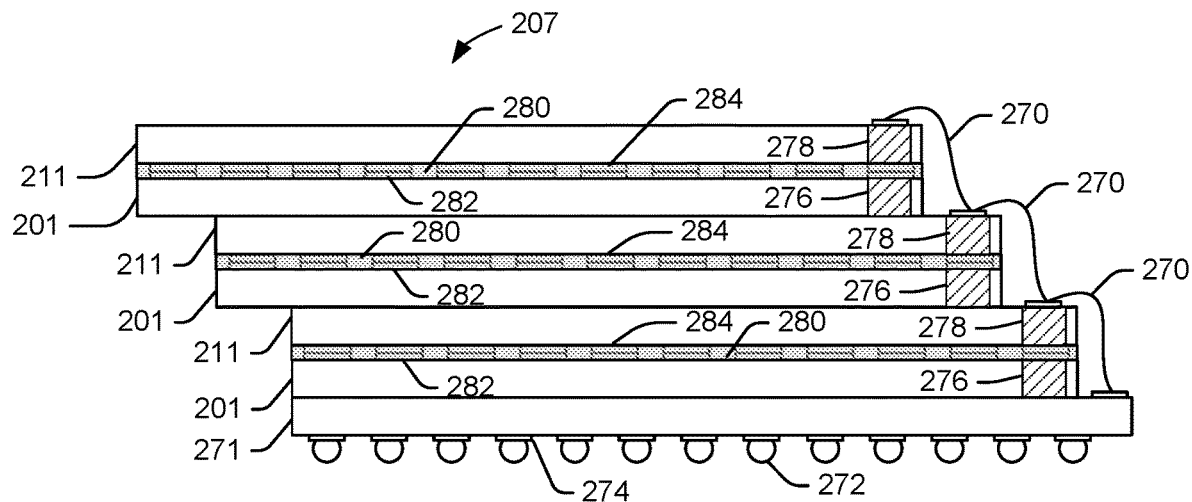
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and a memory controller.

Figure 3B:
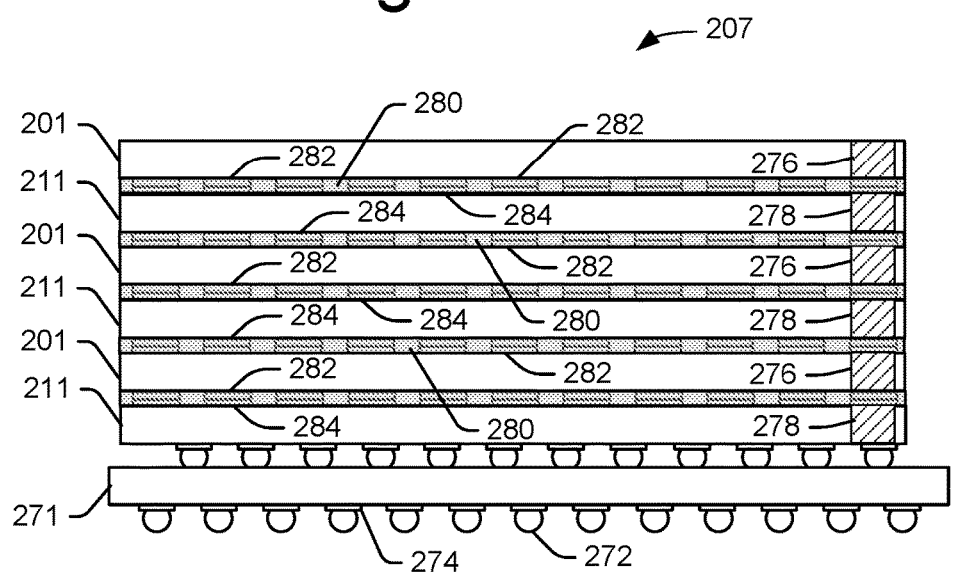

FIG. 3B depicts a side view of another embodiment of an integrated memory assembly 207 stacked on a substrate 271. The integrated memory assembly 206 of FIG. 2B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material.

Figure 4:
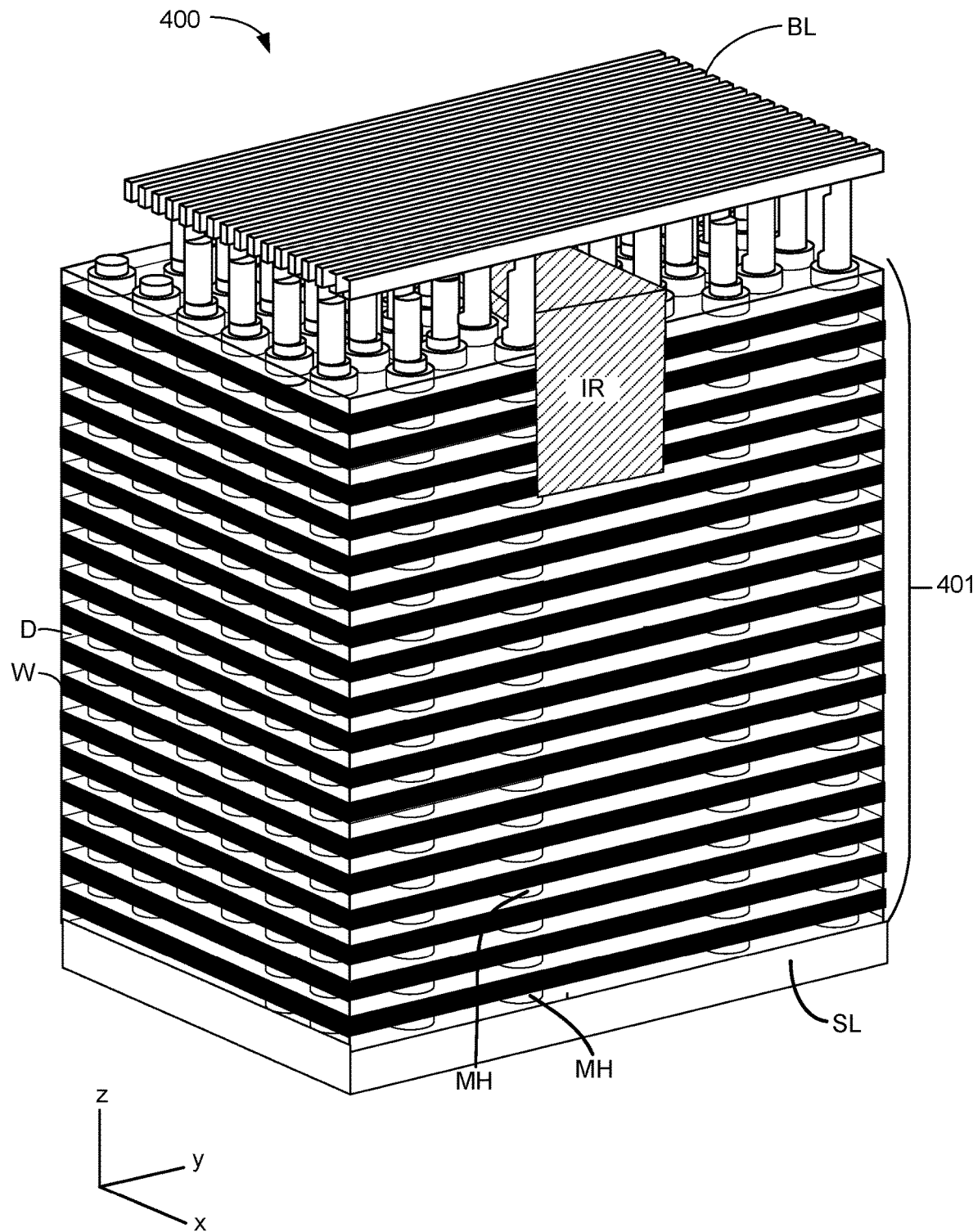
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
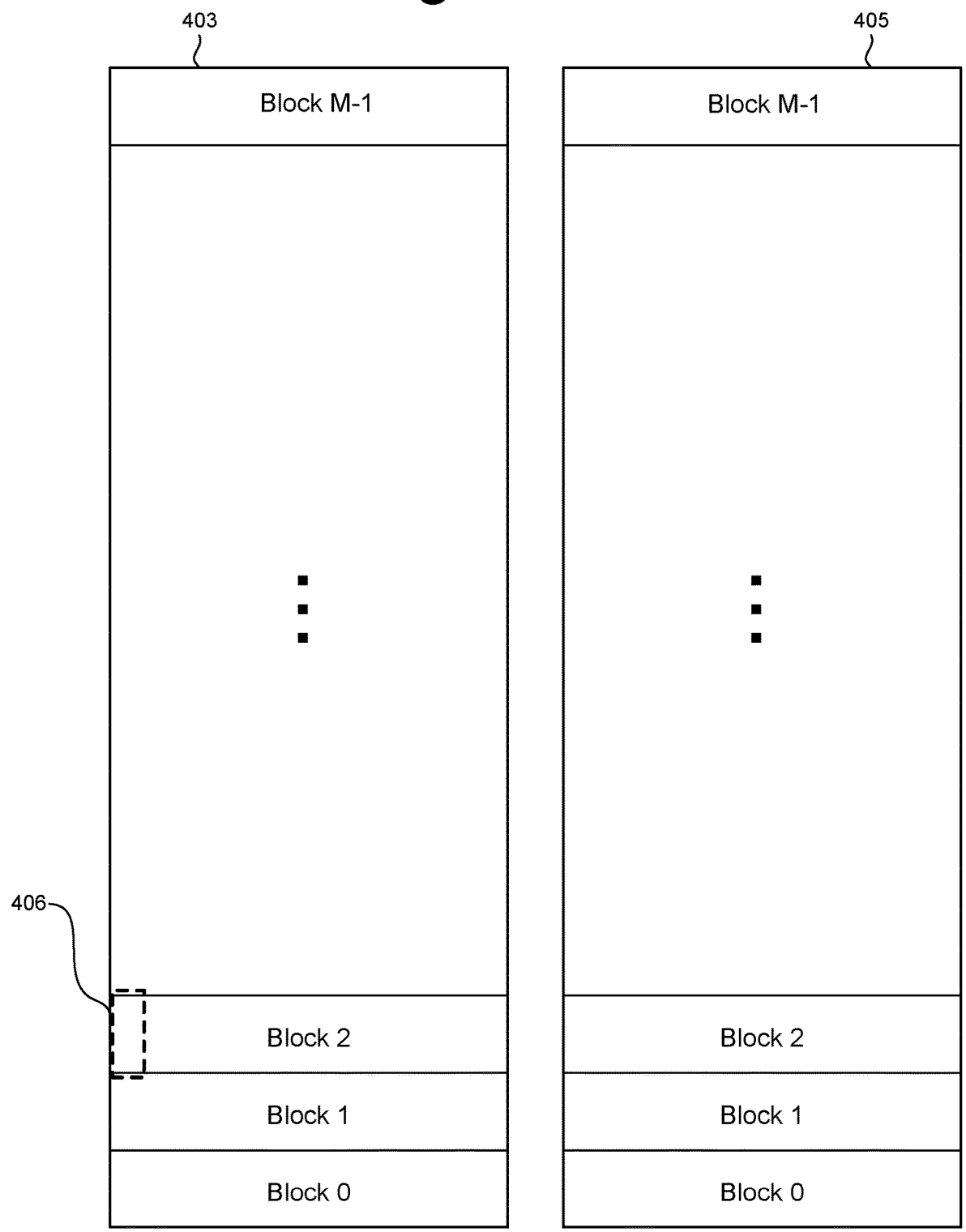
FIG. 4A is a block diagram of one example of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
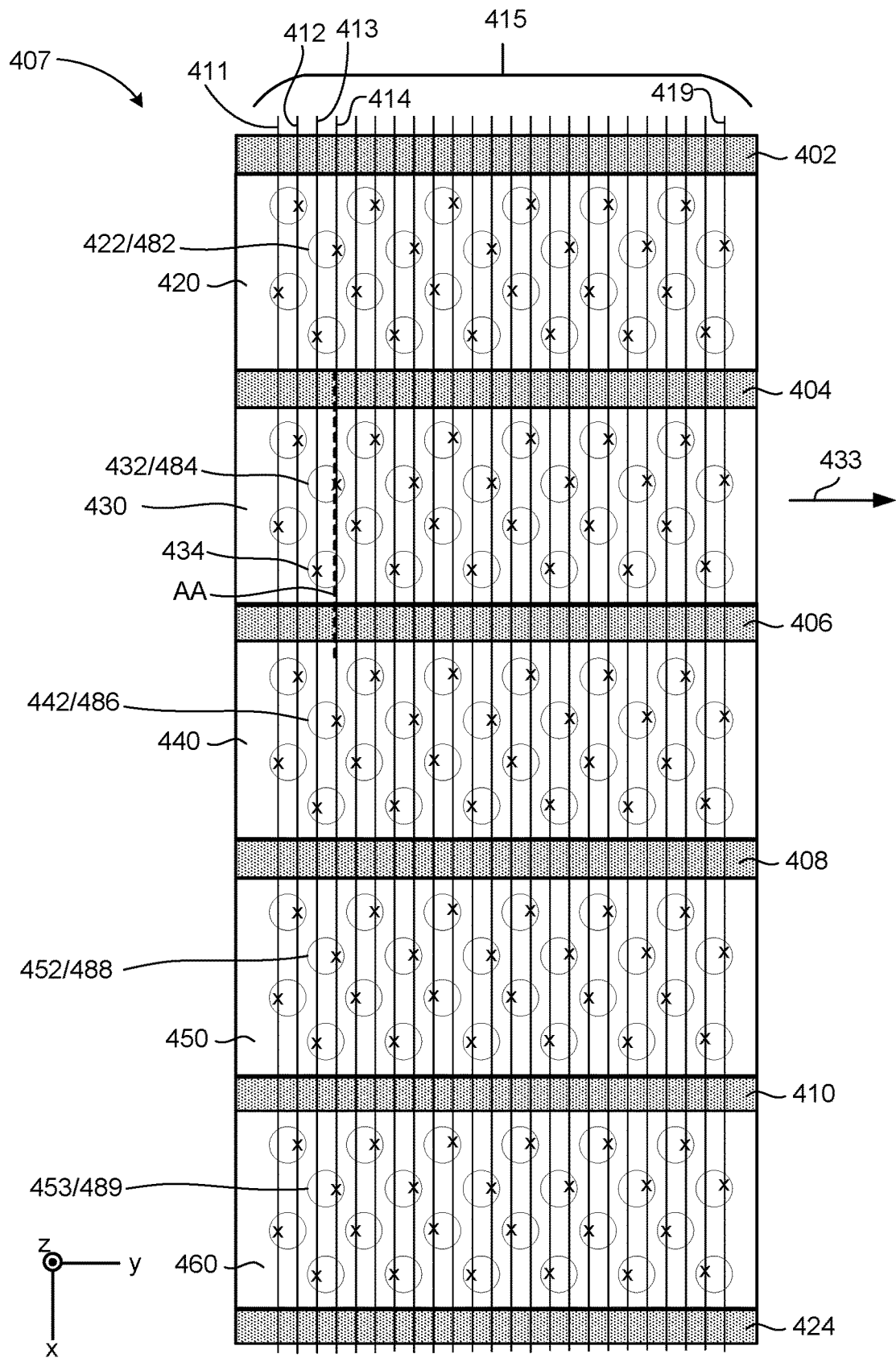
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, ... 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442, 452 and 453.

The physical block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
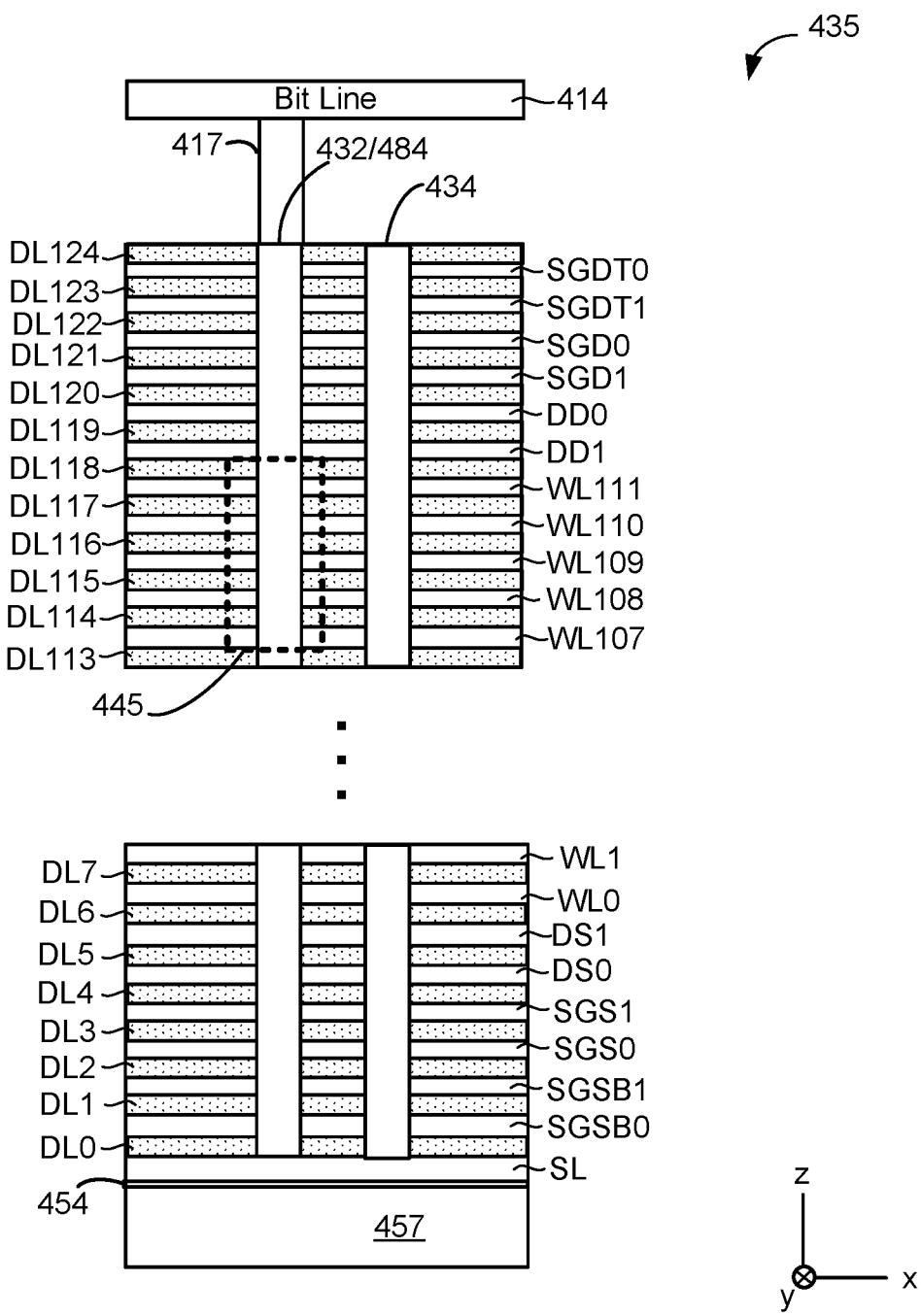
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
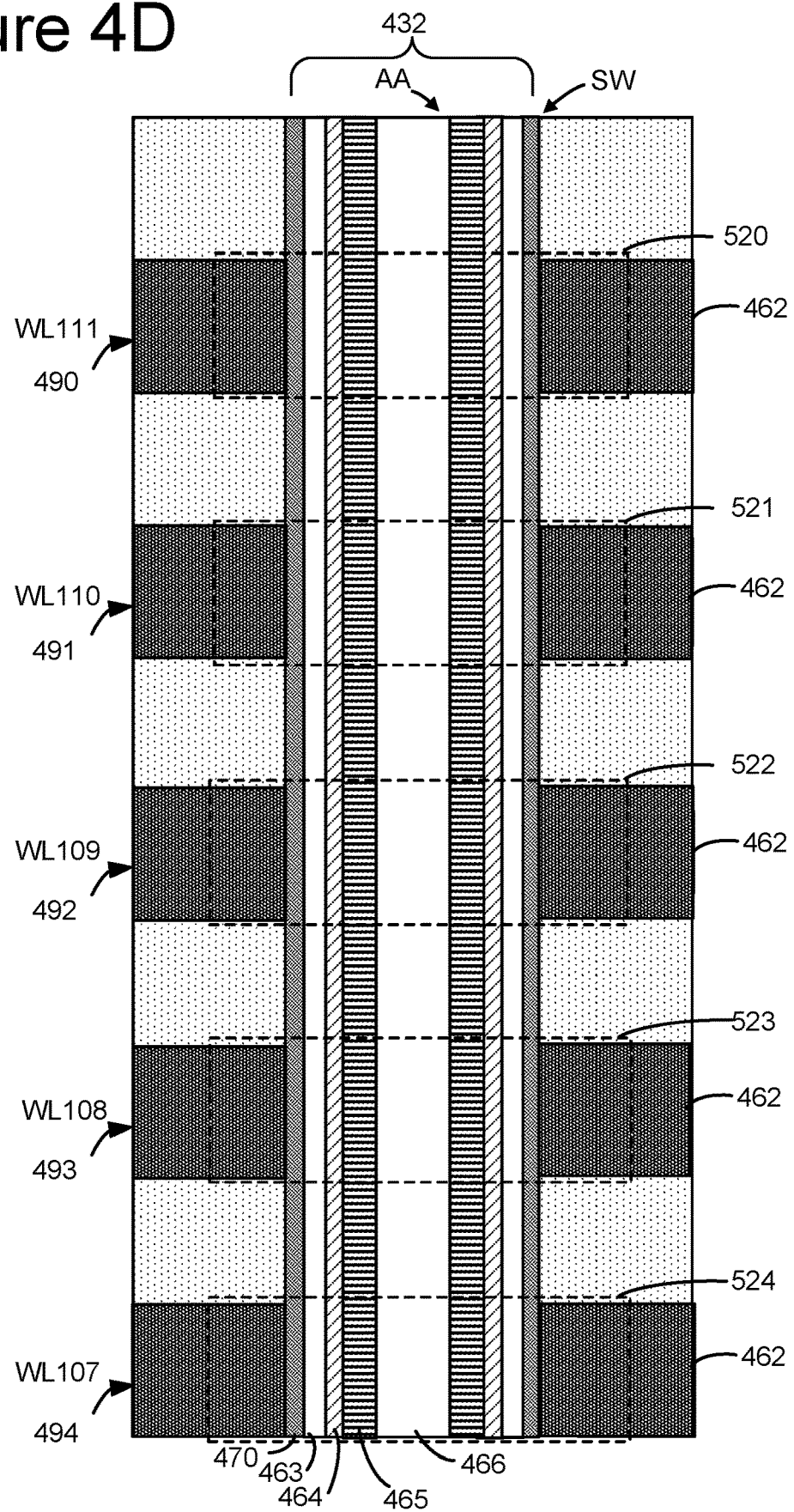
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
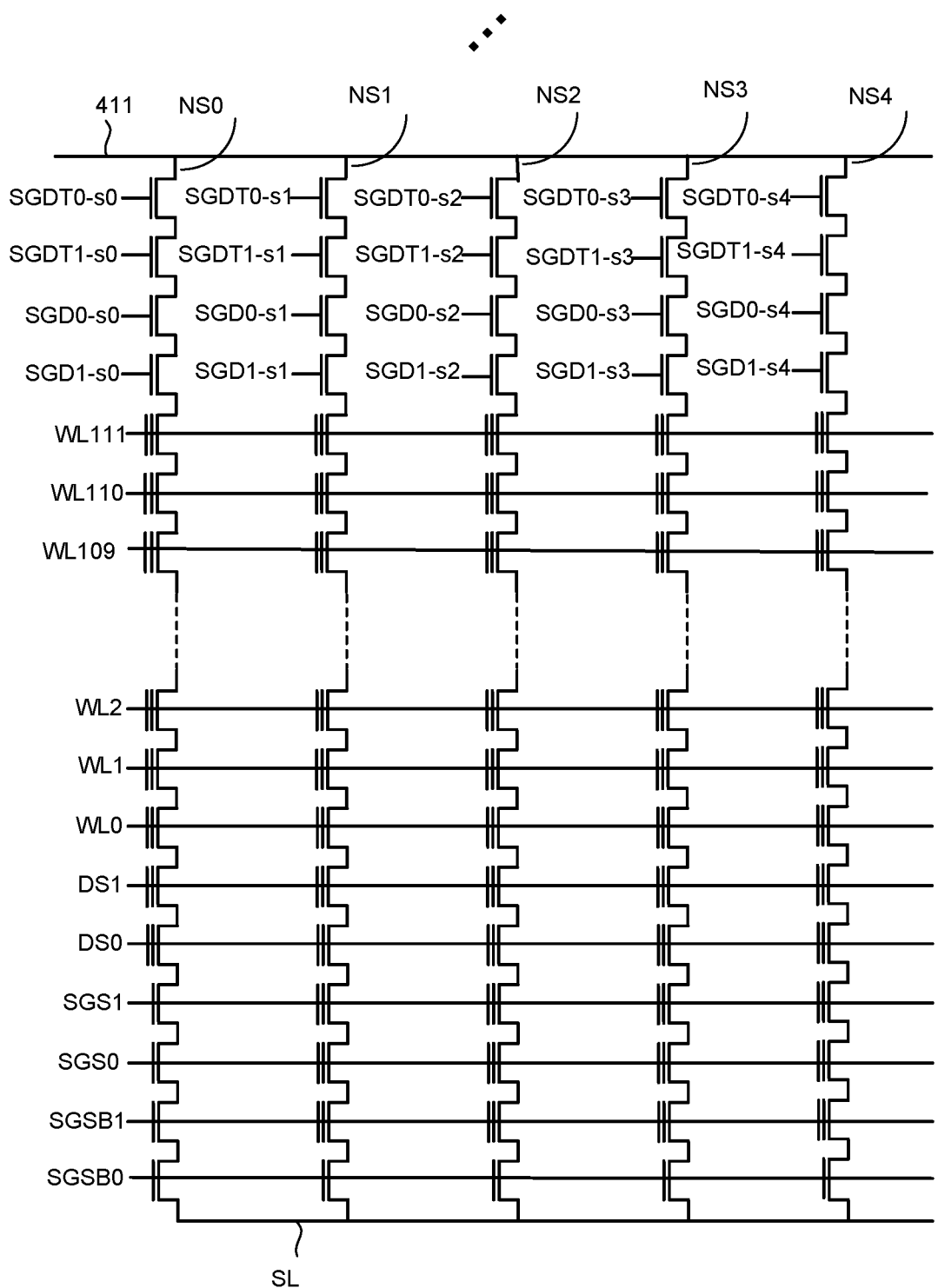
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-$s0$, SGDT1-$s0$, SGD0-$s0$, and SGD1-$s0$. The set of drain side select lines connected to NS1 include SGDT0-$s1$, SGDT1-$s1$, SGD0-$s1$, and SGD1-$s1$. The set of drain side select lines connected to NS2 include SGDT0-$s2$, SGDT1-$s2$, SGD0-$s2$, and SGD1-$s2$. The set of drain side select lines connected to NS3 include SGDT0-$s3$, SGDT1-$s3$, SGD0-$s3$, and SGD1-$s3$. The set of drain side select lines connected to NS4 include SGDT0-$s4$, SGDT1-$s4$, SGD0-$s4$, and SGD1-$s4$. Herein the term "SGD" may be used as a general term to refer to any one or more of the lines in a set of drain side select lines. In an embodiment, each line in a given set may be operated independent from the other lines in that set to allow for different voltages to the gates of the five drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-$s0$, SGDT1-$s0$, SGD0-$s0$, and SGD1-$s0$. A second sub-block corresponds to those vertical NAND strings controlled by SGDT0-$s1$, SGDT1-$s1$, SGD0-$s1$, and SGD1-$s1$. A third sub-block corresponds to those vertical NAND strings controlled by SGDT0-$s2$, SGDT1-$s2$, SGD0-$s2$, and SGD1-$s2$. A fourth sub-block corresponds to those vertical NAND strings controlled by SGDT0-$s3$, SGDT1-$s3$, SGD0-$s3$, and SGD1-$s3$. A fifth sub-block corresponds to those vertical NAND strings controlled by SGDT0-$s4$, SGDT1-$s4$, SGD0-$s4$, and SGD1-$s4$. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other 3D memory structures can also be used with the technology described herein.

Figure 5:
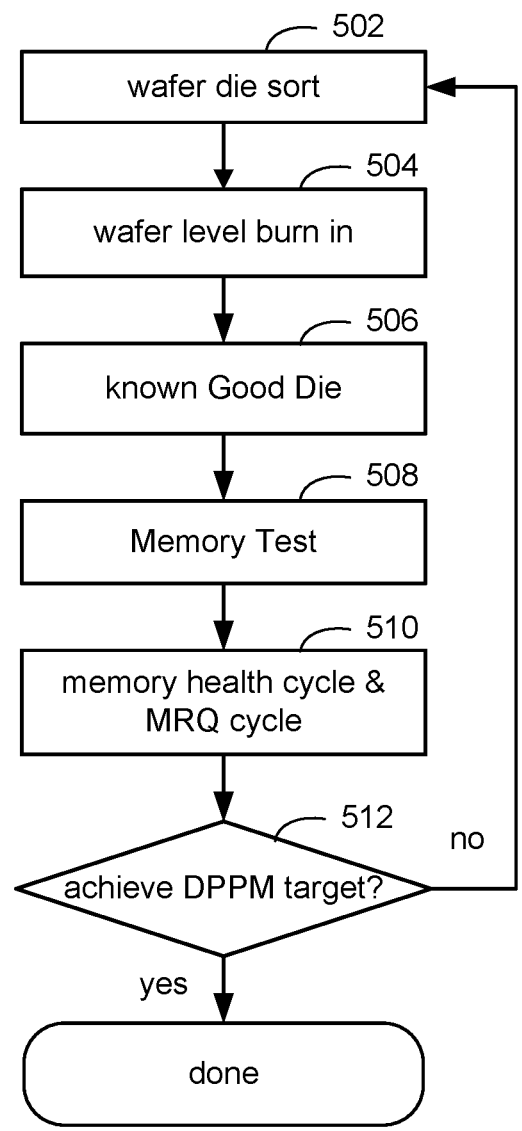
FIG. 5 is a flowchart describing a process performed during research and development of memory devices that generates data which can be used to determine a test flow for the production phase.

FIG. 5 is a flowchart describing a process performed during research and development of memory devices that generates data which can be used to determine a test flow for the production phase. In step 502 of FIG. 5, wafer die sort is performed. In step 504, wafer level burn in is performed. The wafer level burn in test is performed at a warm temperature and includes performing many program/erase cycles to burn in the memory. Meanwhile, test stress and screening for extrinsic defects can be employed in this step for hot temperature coverage. In step 506, a known good die test is performed. The known good die test is performed at lower temperatures in order to test stress and screen extrinsic defects. In step 508, a memory test is performed. The memory test is performed after the die or packaged in hot temperatures for purposes of making sure that the memory meets intended performance. The memory test may include a number of test items, such as a WL leakage test, a BL leakage test, a WL RC test, etc. Each test item may have a number of conditions used to determine whether a defect exists. As an example the conditions for a WL leakage test may be different current magnitudes. There could be many test items (e.g., in some cases about 500 test items) with each test item having many candidate conditions (e.g., in some cases there may be about 20 candidate conditions) for each test item. An embodiment includes a computer-implemented method of determining a production phase test flow that includes at least some of the test items. However, in an embodiment, at least one of the test items is not included in the production phase test flow. Moreover, the computer-implemented method identifies effective conditions from the candidate conditions to thereby reduce DPPM, reduce yield loss, reduce test cost and reduce test time.

In step 510, a memory health cycle test is performed with an MRQ test (memory reliability and quality). Memory health cycle may include an array/program/recycle which mimics customer usage. The MRQ cycle is an array/program/recycle which mimics customer usage; however, it is done at the package level rather than the wafer level of the memory health cycle. A defective part count (e.g., DPPM) is calculated after the MRQ cycle. Thus, the defective part count is defined based on parts that are defective after the MRQ cycle. Therefore, the DPPM reflect parts that do not meet a usage criterion. If it is determined that the DPPM target has been achieved (step 512), then the memory device development process of FIG. 5 is complete; otherwise, the process loops back to step 502 to perform another iteration.

Figure 6:
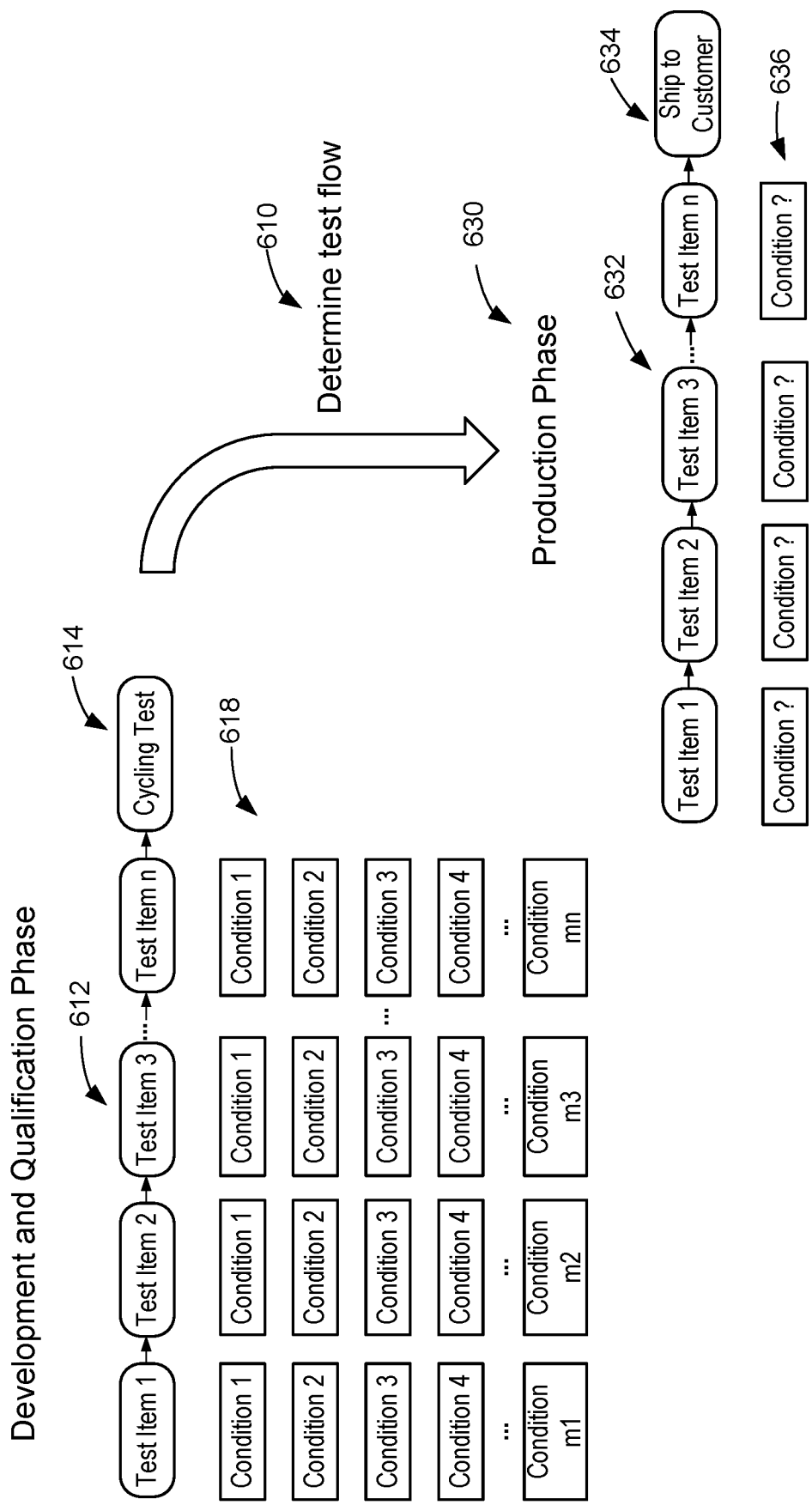
FIG. 6 shows a relationship between testing done at the development and qualification phase versus the production phase.

FIG. 6 shows a relationship between testing done at the development and qualification phase versus the production phase. The development and qualification phase 610 includes running memory tests (referred to as test items 612) and cycling tests 614. Each test item 612 has a number of candidate conditions 618. The "conditions" may also be referred to as "test item conditions." A test item 612 is used to test some aspect of the memory. Examples test items 612 include tests for short circuits, leakage current, RC, etc. As an example, each candidate condition for a leakage current test item may be a different magnitude of the leakage current. The cycling tests 614 may be designed to simulate customer usage. As one example the test item 612 may be run during step 508 and the cycling tests 614 may be used during step 510 in FIG. 5.

The production phase 630 is used to test memory dice that are intended to be shipped to the customer 634. Therefore, the cycling tests 614 are not performed at the production phase 630 so as to not wear out the memory dice. However, during the production phase 630 at least some of the memory tests (e.g., test items 632) are performed. Only one of the conditions 636 needs to be used for each test item 632 in the production phase 630. For example, a leakage test might test for the condition of leakage current greater than 100 nA. One goal of the test flow in the production phase is to successfully locate bad blocks, bad planes, bad dice, or other defective regions of a die. A bad block may be marked as bad with the dice still be used if there are not too many bad blocks on the plane or die. In some cases a die with some defects can still be used but used for a lower performance or lower capacity memory device.

An embodiment includes a method for determining a suitable test flow 610 for the production phase. As will be further explained below, some of the test items might not be effective in the production phase for identifying defects such as bad blocks, bad die, etc. In an embodiment, such ineffective test items are not included in the production phase test flow. Therefore, time is saved in the production phase. Moreover, such ineffective test items could incorrectly identify a block, plane, die, or region of a die as being defective, which increases yield loss. Therefore, by not included such ineffective test items yield loss may be decreased. Moreover, by including effective test items in the production test flow DPPM targets are met. Thus, the number of parts that are defective after some usage criterion (e.g., program/erase cycles) is kept low.

Figure 7:
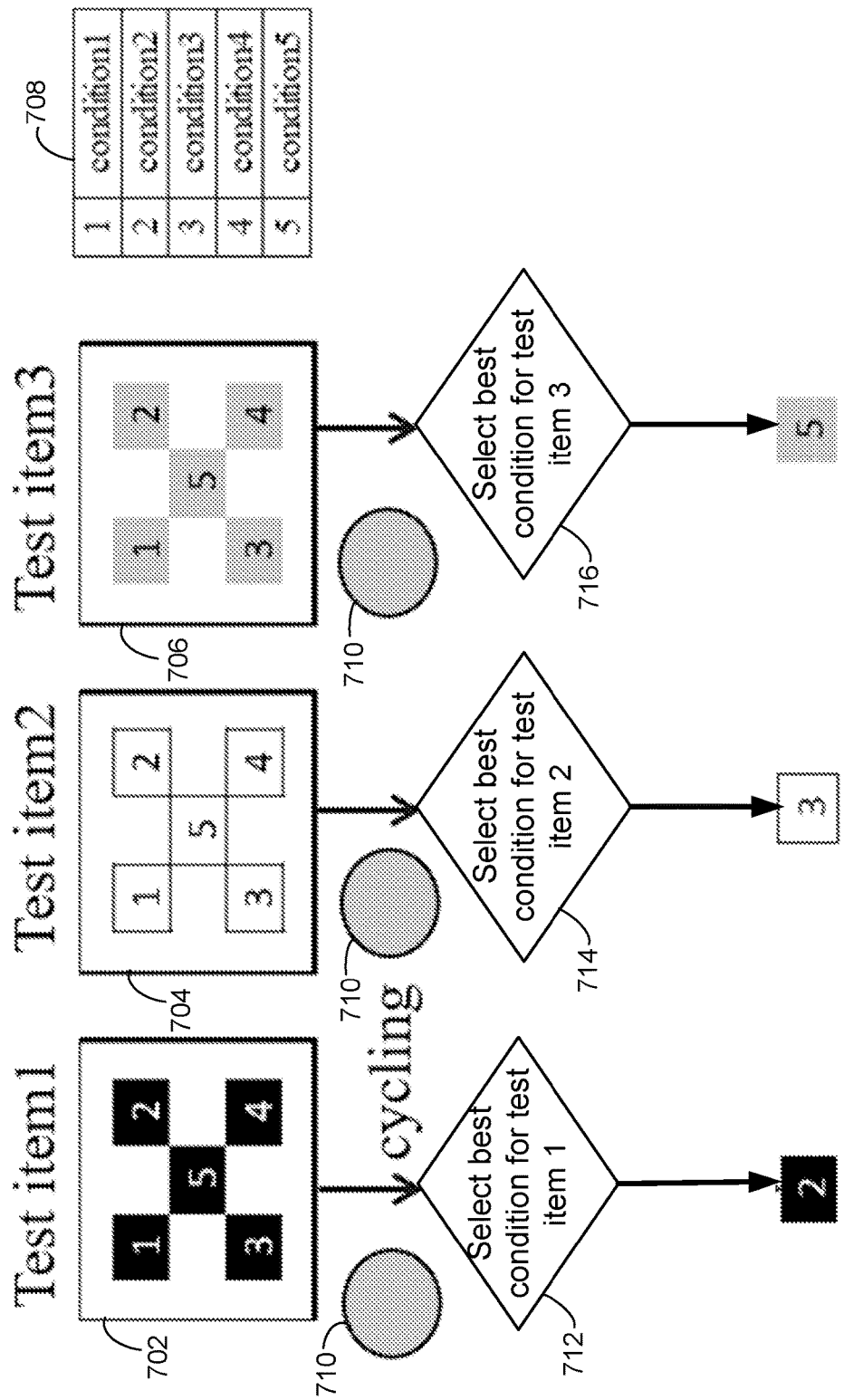
FIG. 7 shows a conventional process for determining a test flow for testing memory dice in a production phase.

FIG. 7 shows a conventional process for determining a test flow for testing memory dice in a production phase. The conventional process may be performed during a development and qualification phase. In this simplified example there are three test items 702, 704, 706 with each test item having five candidate conditions 708. The conventional process selects one condition for each test item. This selection may be based on the results of the cycling test. For example, the cycling tests could identify a number of bad blocks, which are represented by circle 710. In one conventional process, a best condition of test item1 702 is selected in step 712 based on the cycling bad blocks 710; a best condition of test item2 704 is selected in step 714 based on the cycling bad blocks 710; and a best condition of test item3 706 is selected in step 716 based on the cycling bad blocks 710. In the example, condition 2 is selected for test item 1; condition 3 is selected for test item 2; and condition 5 is selected for test item 3.

Figure 8:
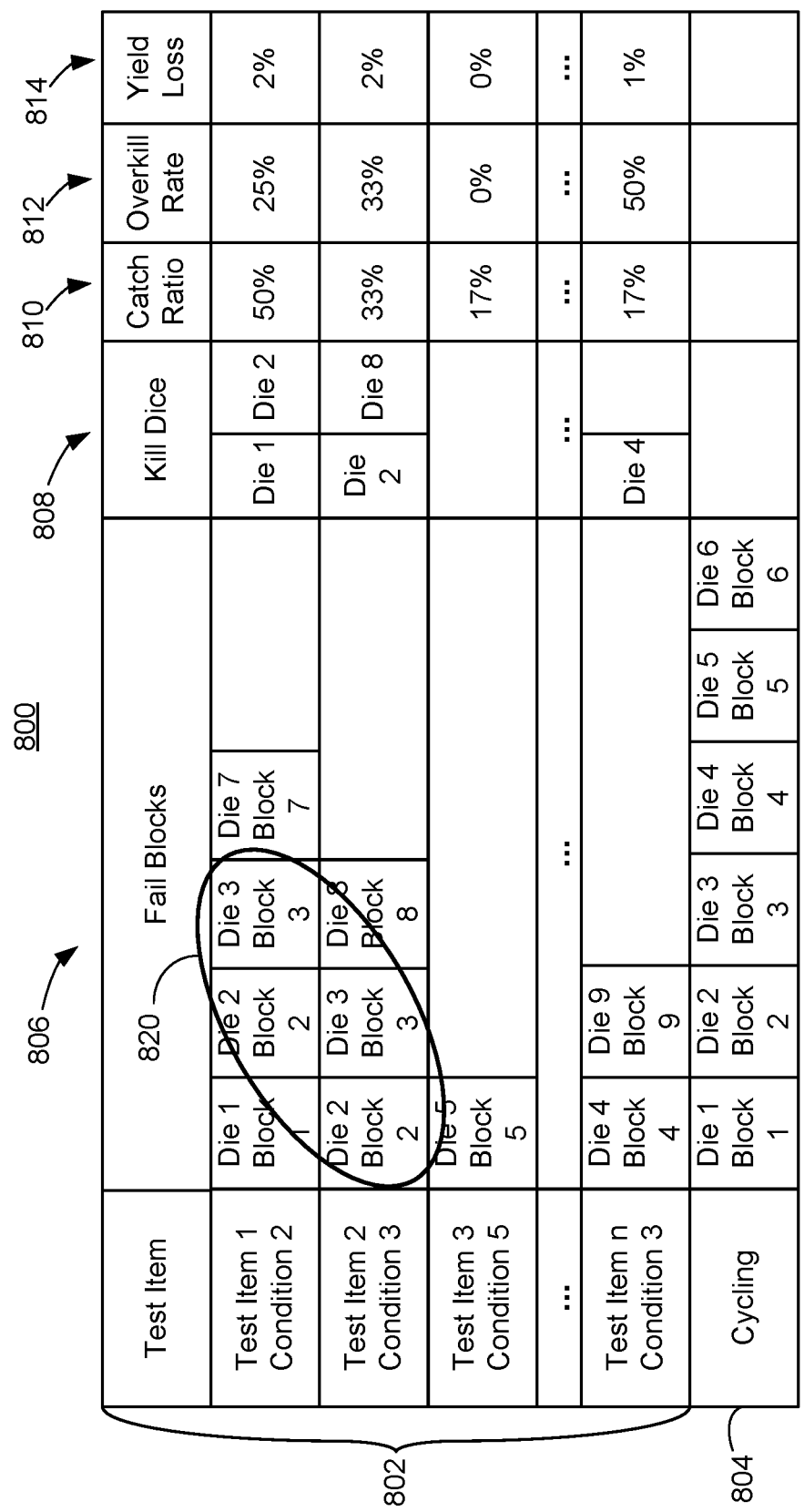
FIG. 8 is a table that shows a simplified example of results of testing of memory dice.

FIG. 8 is a table 800 that shows a simplified example of results of testing of memory dice. The table 800 has a number of rows 802 for different test item conditions and one row 804 for the cycling tests. The fail blocks 806 are the blocks that failed the test item condition for the row. In this simplified example, there are six fail blocks for the cycling tests. The cycling tests may mimic customer usage and may therefore be used to determine dies or blocks that fail a usage criterion. The cycling tests may serve as a benchmark. Thus, the six fail blocks may be referred to as benchmark blocks. In some cases, the benchmark blocks might be determined by tests other than cycling tests that are able to mimic customer usage and may therefore be used to determine dies or blocks that fail a usage criterion. It is desirable for the test item conditions used in the test flow to catch most, if not all, of the benchmark blocks.

FIG. 8 shows that there may be overlap 820 in bad blocks caught (or detected) by different test item conditions. For example, the top two rows show that there are two test item conditions that catch Die2Block2 and Die3Block3. Both of these blocks are benchmark blocks. However, the other block detected as a fail block by test item 2 condition 3 (die8Block8) is not among the benchmark blocks from the cycling tests, which is referred to herein as overkill. Overkill is undesirable. Test item 2/condition 3 can be eliminated from the test flow without losing any coverage due to the overlap with Test item 1/condition 2. Moreover, eliminating test item 2/condition 3 removes the overall block (Die8/Block8). A further benefit is that testing time during the production phase is reduced due to skipping test item 2.

The kill dice column 808 shows dies "killed" by the test item condition of that row. A kill die may be defined as a die that has a number of bad blocks that exceed a threshold. The calculation of a kill die may consider not only the bad blocks of a specific test item, but can also add in bad blocks detected by other test items. However, a test item condition that has overkill may result in a kill die that need not be a kill die. For example, it is possible that test item 2/condition 3 resulted in Die 8 being a kill die due to incorrectly "catching" block 8 of die 8 as a bad block.

The catch ratio column 810 shows the catch ratio for each test item condition. The overkill rate column 812 shows the overkill rate of each test item condition. The yield loss column 814 shows the yield loss of each test item condition. Note that eliminating test item 2/condition 3 does not reduce the overall catch rate as discussed above. However, eliminating test item 2/condition 3 may reduce the yield loss due to the overkill of Die 8 being eliminated.

One technique for calculating the DPPM is in accordance with the following equation:

$$DPPM = \frac{\text{Benchmark (or cycling) fail die count} - \text{test item catch die count}}{\text{Tested die count} - \text{test item kill die count}} * 10^6 \quad \text{Eq. 1}$$

A delta DPPM may be calculated for the example in FIG. 8 as follows:

$$\text{Delta } DPPM = [(6-5)/(100-4)] * 10^6 - [(6-5)/(100-3)] * 10^6 \quad \text{Eq. 2}$$

$$\text{Delta } DPPM = 10417 - 10309 = 107 \quad \text{Eq. 3}$$

The delta DPPM is the difference that occurs due to die 8 being killed verses die 8 not being a kill die. In Equation 2, the results from table 800 are used in Equation 1. As noted, without die 8 being a kill die, the test item kill die count drops from 4 to 3. Therefore, the DPPM drops from 10417 to 10309 (see Eq. 3), resulting in a DPPM improvement of 107. Also, clearly yield loss is reduced by not killing Die 8. An embodiment of a computer-implemented method of determining a production phase test flow selects effective test item conditions and eliminates ineffective test item conditions to thereby result in a lower DPPM, a lower yield loss. Also, there may be fewer test items to thereby save cost and time during production phase memory testing.

Figure 9:
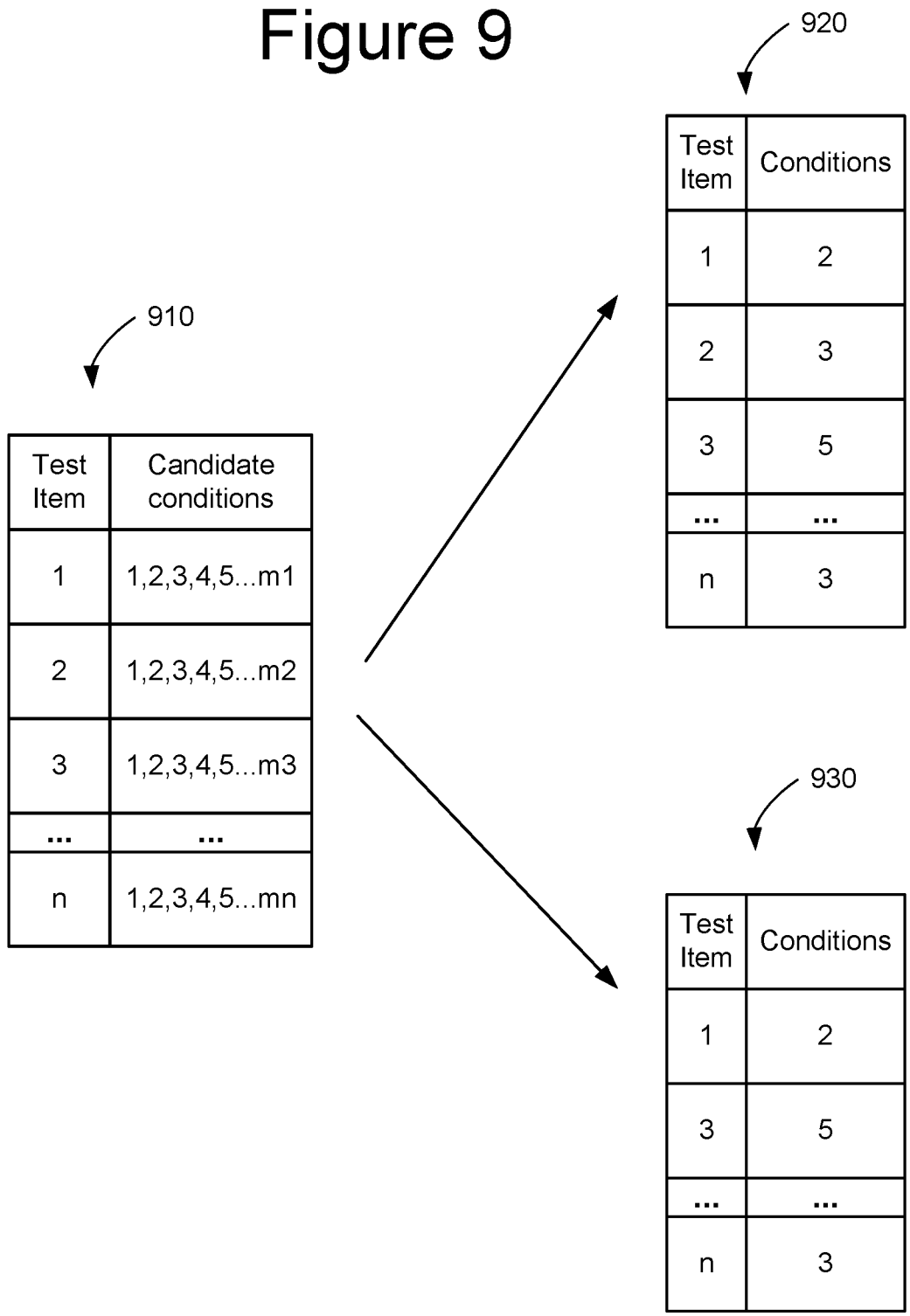
FIG. 9 shows a comparison of a test flow that includes all test items and an embodiment of a test flow that eliminates some test items.

FIG. 9 shows a comparison of a test flow that includes all test items and an embodiment of a test flow that eliminates some test items. Table 910 shows that there are n candidate test items. Each candidate test item has a number of candidate conditions (or "test item conditions"). As an example, there might be about 500 different candidate test items. Each candidate test item could have about 20 candidate conditions. Therefore, there might be about 10,000 total candidate test item conditions. Table 920 shows a test flow for a conventional process. All 500 candidate test items are included in the conventional test flow. One candidate condition is selected for each test items to thereby result in 500 test item conditions in the test flow. Table 930 shows a test flow that results from an embodiment of a process of determining a test flow. Many of the candidate test items are eliminated. For example, candidate test items that would not be effective may be identified and eliminated from the test flow. As an example, the test flow in table 930 may have about 300 test items (each with a condition). Therefore, table 930 may have about 300 test item conditions. The test flow in table 930 may reduce yield loss relative to the conventional test flow in table 920. Moreover, the test flow in table 930 is faster relative to the conventional test flow in table 920 due to the elimination of ineffective test item conditions. Moreover, the test item conditions that are kept in the test flow in table 930 are able to catch benchmark bad blocks thereby resulting in a low DPPM.

Figure 10:
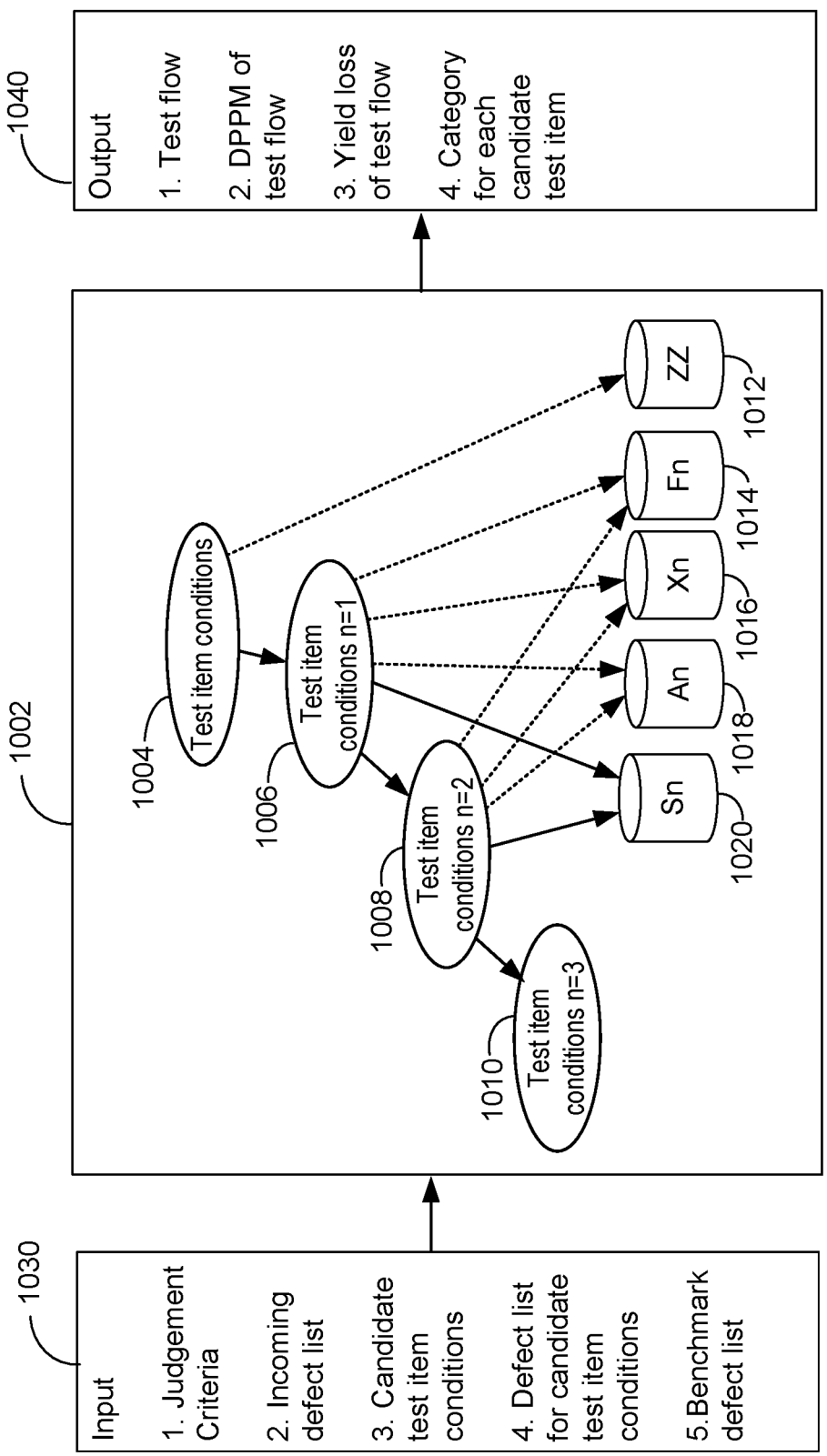
FIG. 10 is a diagram of one embodiment of a software application with its inputs and outputs.

FIG. 10 is a diagram of one embodiment of a software application 1002 with its inputs 1030 and outputs 1040. The inputs include: 1) judgement criteria, 2) an incoming defect list of all test die, 3) candidate test item conditions, 4) a defect list for each candidate test item, and 5) a benchmark defect list. The inputs may be determined based on tests run at a qualification and development phase (see, for example, FIG. 5). The outputs include: 1) a test flow, 2) DPPM of the test flow, 3) Yield loss of the test flow, and 4) a category for each candidate test item condition. In one embodiment, the DPPM is calculated in accordance with Equation 1 above. Note that the DPPM may also be referred to as a type of defect count, and could be expressed in terms other than "per million." In one embodiment, the yield loss is defined as the total die identified as kill dice by the test flow divided by the total dice tested. In one embodiment, the defects in the inputs 1030 in FIG. 10 are bad blocks, which are one example of a defect. However, the inputs could be a different type of defect than a bad block (BB). The benchmark defects may be defects that serve as a benchmark of failure to meet a usage criterion (e.g., program/erase cycles). As one example, the benchmark defects could be determined by cycling tests. The cycling tests could identify bad blocks, which are referred to herein as "cycling bad blocks." Thus, the benchmark defects may be a list of cycling bad blocks (BB). In one embodiment, the benchmark defect list is usage list, which is a list bad blocks that fail after use of the memory dice for a usage criterion (e.g., a number of program/erase cycles).

In an embodiment, the application 1002 places each test item condition into a category based on the judgment criteria. The placement of a particular test item condition may also be based on a comparison of the bad blocks for the particular test item with the cycling bad blocks. In an embodiment, one of the categories (Sn 1020) is for test item conditions that are selected for the production test flow and the other categories (yield loss category ZZ 1012, catch ratio category Fn 1014, defective part improvement category Xn 1016 and An 1018) are for test item conditions that are eliminated from the production test flow.

In an embodiment, the application starts with a set of all test item conditions 1004 and identifies test item conditions that will not be useful during production due to the yield loss being above a yield loss criterion, which may be specified in the judgement criteria. Such high yield loss test item conditions may be placed into the ZZ category 1012. In an embodiment, after removing the high yield loss test item conditions the application analyzes remaining test item conditions 1006 in a first round of analysis. In an embodiment, eliminated test item conditions are placed into one of the Fn category 1014, the Xn category 1016, or the An category 1018. In one embodiment, test item conditions that have a catch ratio that is below a judgement criterion for catch ratio are placed into the Fn category 1014. Such test item conditions may have insufficient DPPM benefit. In one embodiment, test item conditions that have a DPPM improvement that is below a judgement criterion for DPPM improvement are placed into the Xn category 1016. Such test item conditions may catch some cycling bad blocks; however, they may have a high yield loss. In one embodiment, test item conditions that are selected for the production test flow are placed into the Sn category 1020. In one embodiment, the selection for the production test flow is based on both DPPM improvement and extra yield loss. Test item conditions having a DPPM improvement may be desirable for the production test flow; however, test item conditions having an extra yield loss may be undesirable for the production test flow. Therefore, balancing between DPPM improvement and extra yield loss may be performed to determine which test item conditions to select for category Sn 1020. After a test item condition is selected for the production test flow there is no need for any other test item conditions for the test item corresponding to the selected test item condition. Therefore, any test item conditions that remain for the selected test item may be eliminated and placed into the An category 1018. After the round of analysis the test item conditions in set 1006, there will be a smaller set of test item conditions 1008. The set of test item conditions 1008 may be analyzed in the same manner as set 1006. Next, there could be a still smaller set of test item conditions 1010 to analyze. The process may continue in a similar manner on smaller sets of test item conditions until all test item conditions have been placed into one of the categories (e.g., either selected for the production test flow or eliminated).

Figure 11:
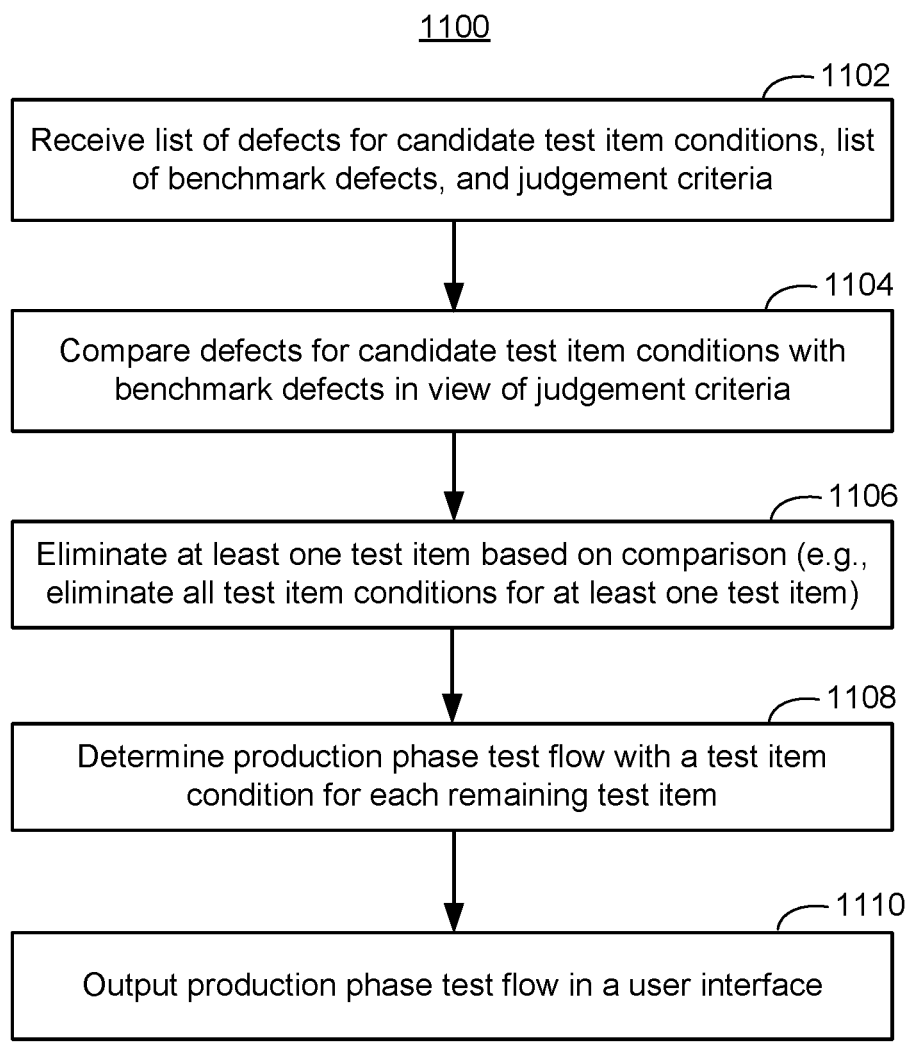
FIG. 11 is a flowchart of a process of determining a production phase test flow for testing memory dice.

FIG. 11 is a flowchart of a process 1100 of determining a production phase test flow for testing memory dice having memory cells. In one embodiment, the process 1100 is performed by executing processor executable instructions on a processor. The processor executable instructions may be stored on a processor readable storage medium. In one embodiment, the process is implemented by a computer system (e.g., computer system 2600 in FIG. 26). Step 1102 includes receiving a list of defects for candidate test item conditions, a list of benchmark defects, and judgment criteria. In one embodiment, the step 1102 includes receiving a list of bad blocks (BB) for candidate test item conditions and a list of benchmark bad blocks. The benchmark bad blocks identify blocks that fail to meet a usage criterion and may be cycling bad blocks. Step 1104 includes comparing defects for candidate test item conditions with benchmark defects in view of the judgment criteria.

Step 1106 includes eliminating at least one test item based on the comparison. Step 1106 eliminates all test item conditions for the at least one test item. As one example, there might be about 500 test items at the start of process 1100. Many of the test items (e.g., 200) could be eliminated in process 1100.

Step 1108 includes determining a production phase test flow with a test item for each remaining test item. Step 1110 includes outputting the production phase test flow in a user interface.

Figure 12:
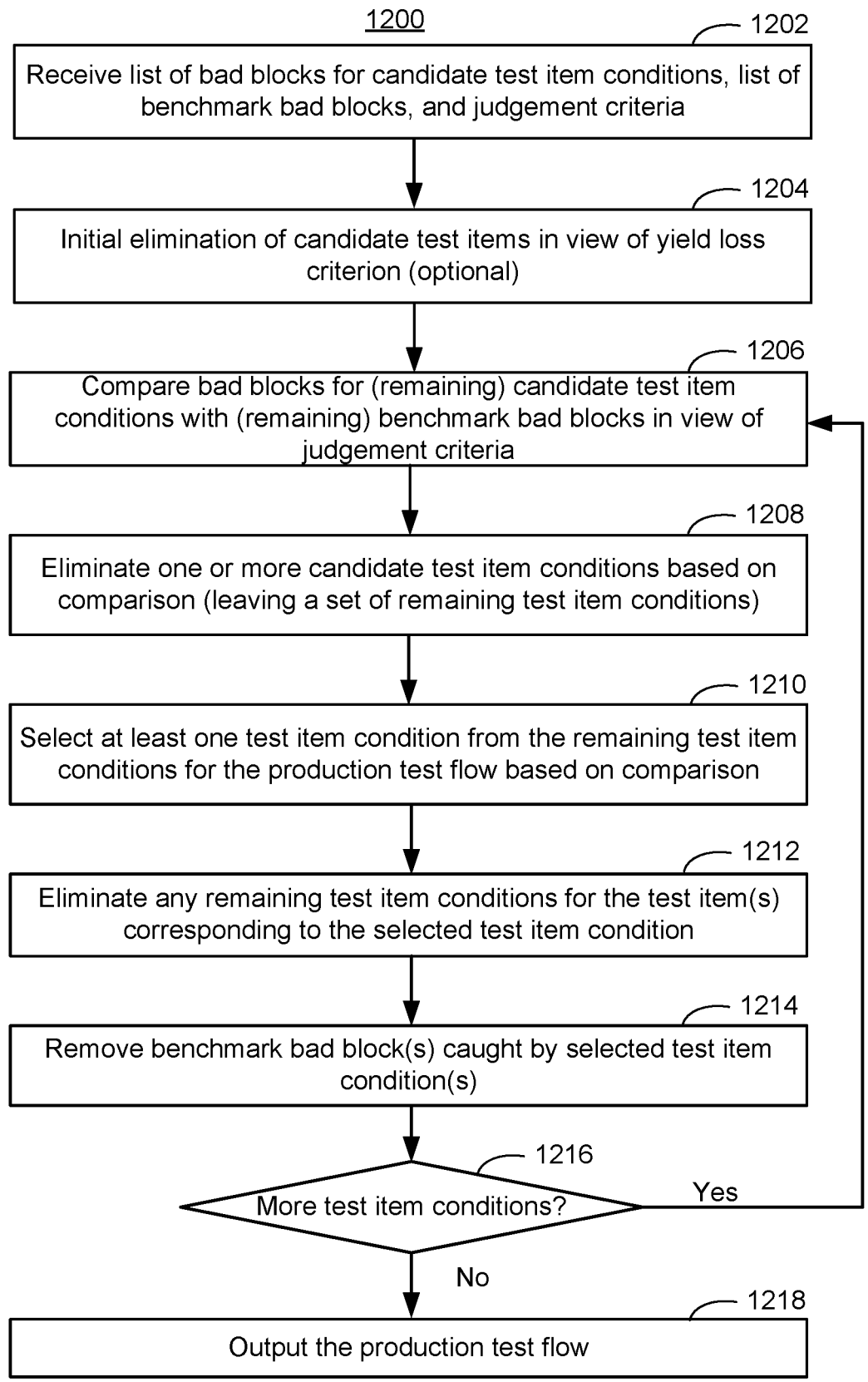
FIG. 12 is a flowchart of a process of determining a production phase test flow for testing memory dice.

FIG. 12 is a flowchart of a process 1200 of determining a production phase test flow for testing memory dice. Process 1200 provides further details for an embodiment of process 100 in FIG. 11. In one embodiment, the process 1200 is performed by executing processor executable instructions on a processor. The processor executable instructions may be stored on a processor readable storage medium. In one embodiment, the process is implemented by a computer system (e.g., computer system 2600 in FIG. 26). Step 1202 includes receiving a list of bad blocks for candidate test item conditions, a list of benchmark bad blocks, and judgment criteria. Note that process 1200 may be modified to operate for defects other than bad blocks. Also note that the benchmark bad blocks may be blocks identified as bad due to cycling tests (see, for example, step 510 in FIG. 5). However, the benchmark bad blocks may be identified in a manner that is not limited to cycling tests.

Optional step 1204 includes an initial elimination of candidate test items in view of yield loss criterion. In one embodiment, the eliminated candidate test items are placed into the ZZ category 1012.

Next steps 1206-1214 are performed one or more times until all candidate test item conditions have either been selected for the production test flow or eliminated. Step 1206 includes comparing bad blocks for remaining candidate test item conditions with remaining benchmark blocks in view of the judgement criteria. Step 1208 includes eliminating one or more candidate test item conditions based on the comparison of step 1206. The candidate test item conditions will not be included in the production test flow. Step 1208 may eliminate candidate test item conditions based on a catch ratio being below a catch ratio threshold, a DPPM improvement being below a DPPM improvement threshold or other factors. In an embodiment, the eliminated test item conditions are placed into the Fn category 1014 or the Xn category 1016, but other categories could be used. Step 1210 includes selecting at least one test item condition from the remaining test item conditions for the production test flow based on the comparison of step 1206. In one embodiment, this step balances DPPM improvement with extra yield loss. The selected test item conditions may be placed into the Sn category 1020. Step 1212 includes eliminating any remaining test item conditions for the test items that correspond to the test item conditions selected in step 1210. These eliminated test item conditions may be placed into the An category 1018 in step 1212. Step 1212 assures that there will be only one test item condition per test item in the production test flow. Step 1214 is to remove any benchmark bad blocks that were caught by the selected test item conditions. Since these benchmark bad blocks are caught by the selected test item conditions there is no need to look for another test item condition to also catch these benchmark bad blocks. If there are still more test item conditions to evaluate (step 1216=yes) then steps 1206-1214 are performed again. Note that the list of benchmark bad blocks will be reduced for the next iteration of steps 1206-1214, which may change the calculations in the comparison in the next iteration of step 1206. After all test item conditions have either been selected for the production test flow or eliminated, the production test flow is output in step 1218.

Figure 13:
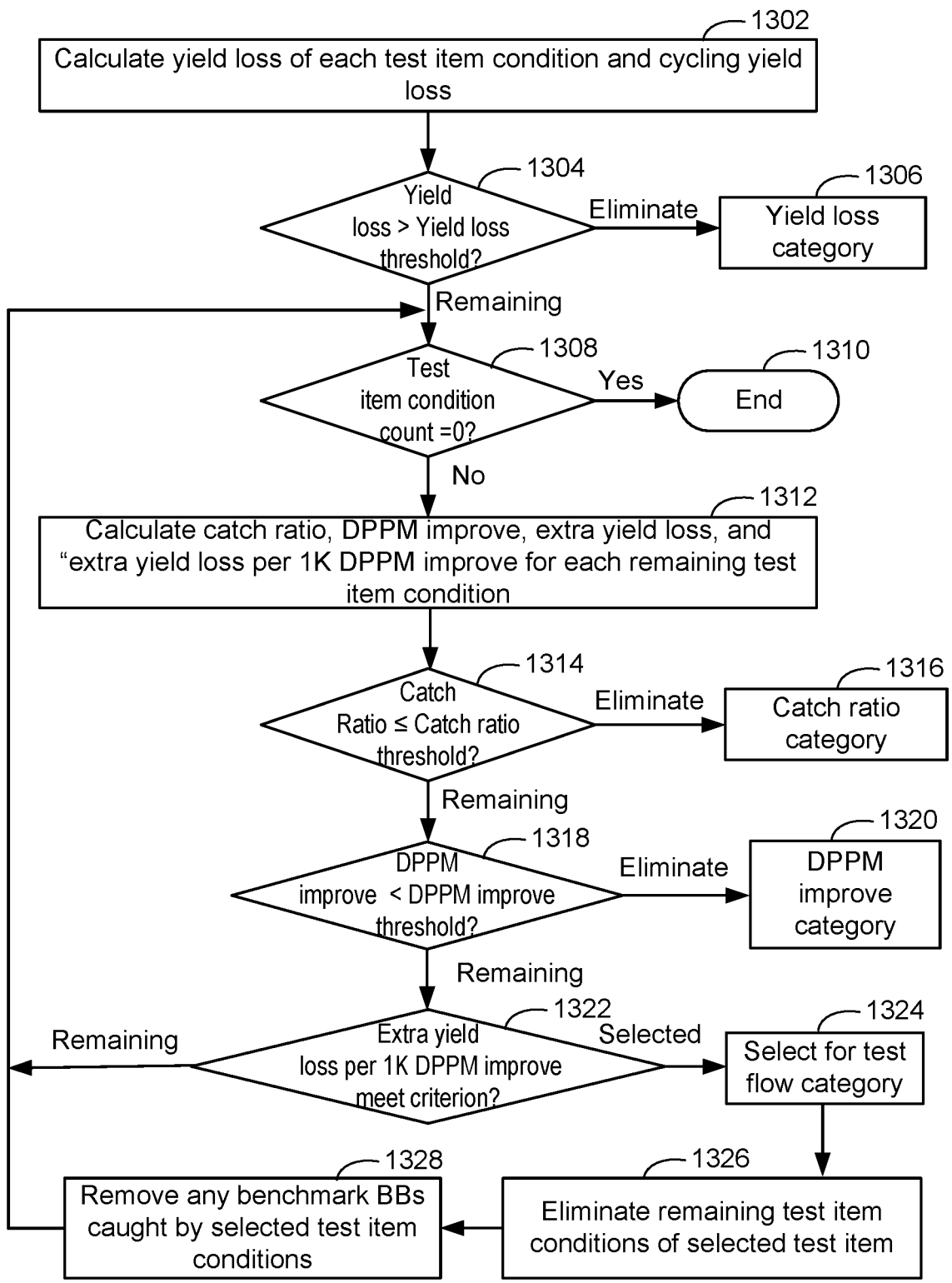
FIG. 13 is a flowchart of a process of determining a production phase test flow for testing memory dice.

FIG. 13 is a flowchart of a process 1300 of determining a production phase test flow for testing memory dice. In one embodiment, the process 1300 is performed by executing processor executable instructions on a processor. In one embodiment, the process is implanted by a computer system. Process 1300 provides further details of an embodiment of process 1200 in FIG. 12. Step 1302 includes calculating a yield loss of each candidate test item condition and cycling yield loss.

Step 1304 may be performed for each candidate test item condition. Step 1304 includes a determination of whether the yield loss for the candidate test item condition exceeds a yield loss threshold. One example of the yield loss threshold is a percentage of die tested. Another example of a yield loss threshold is based on the cycling yield loss. For example, the user may specify that the yield loss threshold is 1.5 times the cycling yield loss. In an embodiment, the yield loss threshold may be provided in the user interface 1030 as one of the judgment criteria (see FIG. 10). If yield loss for the candidate test item condition exceeds a yield loss threshold, then the candidate test item condition is eliminated at step 1306, which includes placing the eliminated test item condition into the yield loss category (e.g., ZZ category 1012. Candidate test item condition that are not eliminated are remaining test item conditions that are further analyzed at step 1308. Step 1308 is a determination of whether the candidate test item condition count is 0. In other words, step 1308 includes a determination of whether there are any remaining candidate test item conditions. If not, then the process ends at step 1310. If there are any remaining candidate test item conditions then some calculations may be performed in step 1312.

Step 1312 may include calculating a catch ratio, a DPPM improvement, an extra yield loss, and an "extra yield loss per 1K DPPM" for each remaining test item condition. One or more of calculations in Equations 4 to 14, which are described below, may be used in step 1312.

Step 1314 may be performed for each remaining candidate test item condition. Step 1314 includes a determination of whether the catch ratio of the particular test item condition is less than or equal to a catch ratio threshold. The catch ratio threshold may be provided in the user interface as a judgment criteria (see 1030, FIG. 10). In one embodiment, step 1314 tests for whether the catch ratio is zero. In other words, step 1314 may determine whether the particular test item condition fails to catch any bad blocks. Those test item condition that have a catch ratio less than or equal to the catch ratio threshold are eliminated at step 1316 by, for example, placing the eliminated test item condition into the Fn category 1014. The test item condition that pass the test in step 1314 are then processed as remaining test item condition in step 1318.

Step 1318 may be performed for each remaining test item condition. Step 1318 includes a determination of whether the DPPM improvement of the particular test item condition is less than a DPPM improve threshold. The DPPM improve threshold may be provided in the user interface as a judgment criteria (see 1030, FIG. 10). Those test item condition that have a DPPM improvement less than the DPPM improve threshold are eliminated at step 1320 by, for example, placing the eliminated test item condition into the Xn category 1016. The candidate test item conditions that pass the test in step 1318 are then processed as remaining test item condition in step 1322.

Step 1322 may be performed for each remaining candidate test item condition. Step 1322 includes a determination of whether the extra yield loss per 1K DPPM improvement meets a criterion. Those test item conditions that pass this test are selected for the production test flow at step 1324 by, for example, placing the selected test item condition into the Sn category 1020. Step 1324 will therefore select one or more test items for inclusion in the production test flow. Step 1326 includes eliminating any remaining test item conditions that are associated with the test items just selected for the production test flow. Step 1328 includes removing any cycling bad blocks that were caught by the selected test item conditions. The process then returns to step 1308. Note that test item conditions that were not selected in step 1324 or eliminated in step 1326 are remaining test item conditions for the next iteration.

FIG. 14 is an embodiment of a user interface 1400 that may be presented in a display screen to allow the user to enter input for determining a production test flow. In one embodiment, the application 1002 provides the user interface 1400. The user interface 1400 is able to receive: 1) judgment criteria, 2) an incoming BB list, 3) candidate test item conditions, 4) BB lists for candidate test item conditions, and 5) a cycling BB list. The judgment criteria includes a "Screen ZZ" which pertain to one or more yield loss criterion. In the example in FIG. 14 the yield loss criteria includes a maximum yield loss and a multiplier for a cycling yield loss. The Screen ZZ criterion may be used in step 1204 in FIG. 12 or step 1304 in FIG. 13. The "Screen 01" pertains to selecting test item conditions for the production test flow. In this example, the selection criterion is extra yield loss per 1K DPPM. In the example interface 1400, the Screen 01 selection criterion is pre-defined. However, another option is to allow the user to input an aspect of the selection criterion. In this example, "Screen Fn" pertains to catch ratio. In this example, the user can specify that the criterion for elimination is a catch ratio of 0 or a catch ratio less than or equal to some percentage. The Screen Fn criterion may be used in step 1208 in FIG. 12 or step 1314 in FIG. 13. In this example, "Screen Xn" pertains to DPPM improvement. In this example, the user can specify that the criterion for elimination is a DPPM improvement of less than or equal to some value. The Screen Xn criterion may be used in step 1208 in FIG. 12 or step 1318 in FIG. 13. Allowing the user to specify values used in judgment criterion has the technical benefit of allowing the user to adjust the values depending on the state of the development of the memory.

FIG. 15 depicts a table 1500 of incoming bad blocks. The table 1500 may be received in the user interface 1400 shown in FIG. 14. Column 1510 contains lot ID, column 1520 contains the wafter number (NO), column 1530 contains the die x location, column 1540 contains the die y location, column 1550 lists the plane, and column 1560 contains the block number of the incoming bad block.

FIG. 16 depicts a table 1600 of candidate test item conditions. The table 1600 may be received in the user interface 1400 shown in FIG. 14. Each row pertains to a different candidate test item condition. Column 1610 identifies the test item, column 1620 identifies the candidate test item condition, column 1630 may contain optional details about the test item, column 1640 may contain optional details about the test item condition.

Figure 17:
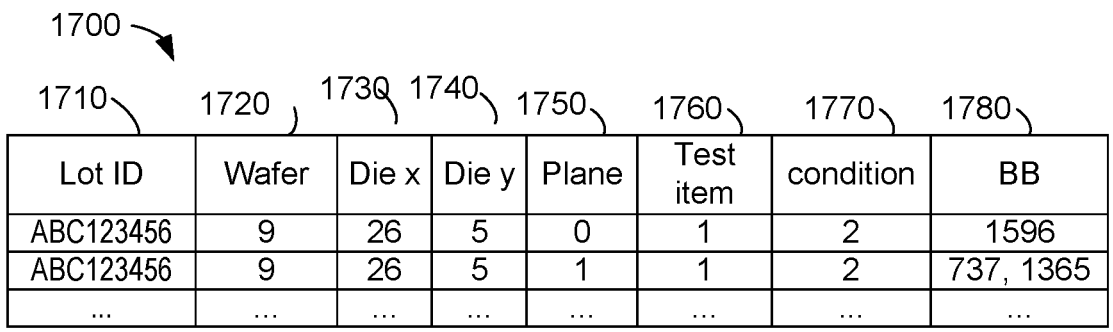
FIG. 17 depicts a table of bad blocks detected by each candidate test item condition.

FIG. 17 depicts a table 1700 of bad blocks detected by each candidate test item condition. The table 1700 may be received in the user interface 1400 shown in FIG. 14. The table may have one row for each candidate test item condition. Column 1710 contains lot ID, column 1720 contains the wafter number (NO), column 1730 contains the die x location, column 1740 contains the die y location, column 1750 lists the plane, column 1760 identifies the test item, column 1770 identifies the candidate test item condition, and column 1780 contains the block numbers of any bad blocks detected by the candidate test item condition in that row.

Figure 18:
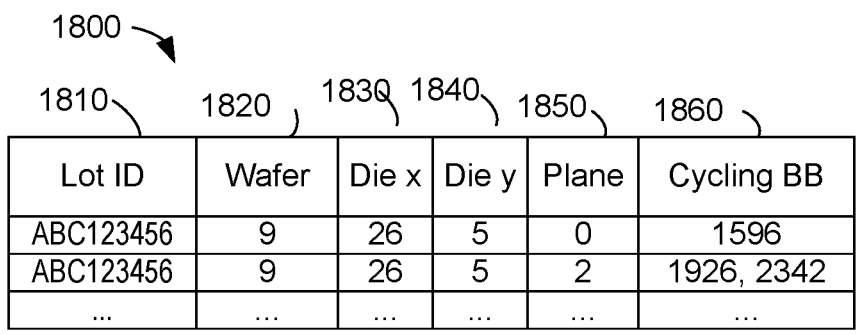
FIG. 18 depicts a table of bad blocks detected by the cycling test.

FIG. 18 depicts a table 1800 of bad blocks detected by the cycling test. The table 1800 may be received in the user interface 1400 shown in FIG. 14. Column 1810 contains lot ID, column 1820 contains the wafter number (NO), column 1830 contains the die x location, column 1840 contains the die y location, column 1850 lists the plane, column 1860 contains the block numbers of bad blocks.

FIGS. 19-21 are tables depicting output of an embodiment of an application that determines a production phase test flow for memory. FIG. 19 depicts a table 1900 of the test flow. Each row pertains to a different test item condition that is included in the production test flow. Column 1910 identifies the test item, column 1920 identifies the test item condition for the test item in that row, column 1930 may contain optional details about the test item, column 1940 may contain optional details about the test item condition.

FIG. 20 depicts a table 2000 that shows estimated DPPM 2010 and estimated yield loss 2020 for the production test flow. In an embodiment, DPPM is determined as described in Equation 1. In an embodiment, the yield loss is the percentage of dies killed (as determined by the test flow) out of all dies tested. A kill die may be defined as a die have more than a threshold number of bad blocks, as one example. However, another criterion may be used for kill dice. For example, defects other than bad blocks may be used to define kill dice.

FIG. 21 depicts a table 2100 that shows what category caused the elimination of candidate test item conditions. Each row pertains to a different candidate test item condition that is not included in the production phase test flow. Column 2110 identifies the test item, column 2120 identifies the test item condition for the test item in that row, column 2130 may contain optional details about the test item, column 2140 may contain optional details about the test item condition, column 2150 shows the category by which the candidate test item condition of that row was eliminated. In an embodiment, the categories include a ZZ category 1012, an Fn category 1014, an Xn category 1016 and an An category 1018 (see, FIG. 10); however, other categories could be used.

Figure 22:
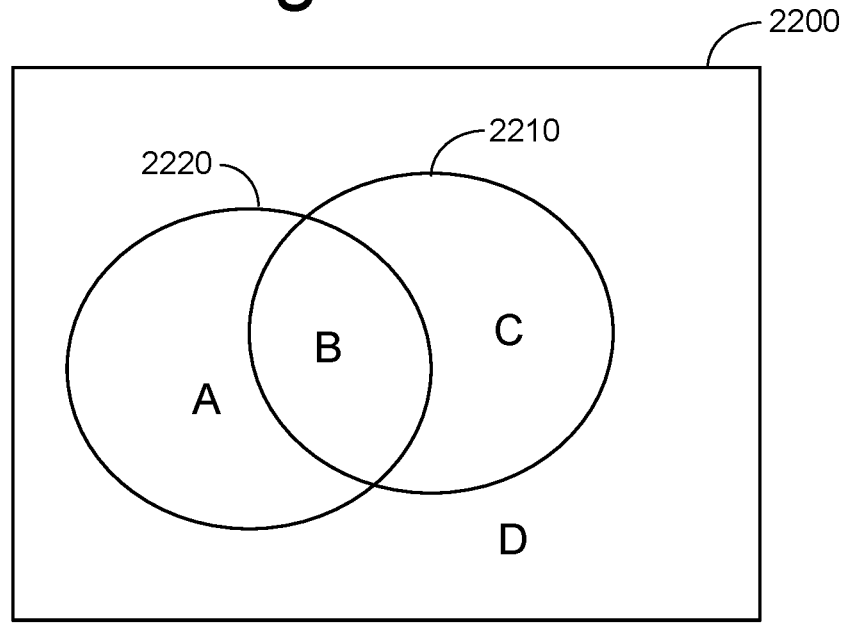
FIG. 22 is a diagram illustrating, at a block level, relationships between bad blocks identified by remaining candidate test item conditions and remaining bad blocks identified by cycling.
Figure 23:
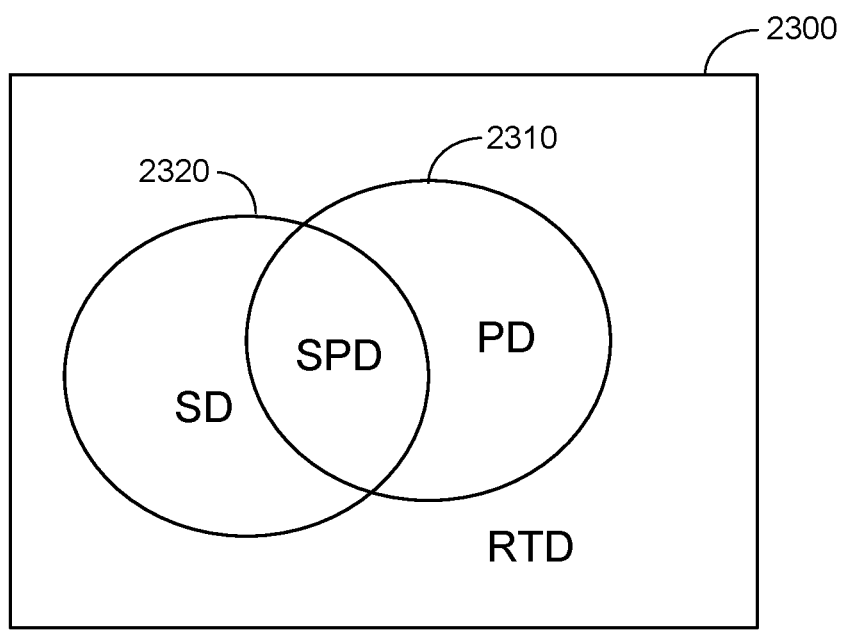
FIG. 23 is a diagram illustrating, at a die level, relationships between kill dice identified by a selected candidate test item condition and kill dice identified by remaining candidate test item conditions.

FIGS. 22 and 23 will now be discussed to explain concepts in an embodiment of determining a production test flow. FIG. 22 is a diagram illustrating, at a block level, relationships between bad blocks identified by remaining candidate test item conditions and remaining bad blocks identified by cycling. A remaining candidate test item condition refers to a candidate test item condition that has either not yet been selected for inclusion in the production test flow or that has not yet been eliminated. A remaining cycling fail block refers to a cycling fail block that has not yet been removed from consideration due to the bad block being caught by a test item condition that has been selected for inclusion in the production test flow. Thus, note that as test item conditions are selected for inclusion in the production test flow any bad blocks caught by such test item conditions may be removed from further consideration.

The rectangle 2200 represents all tested memory blocks. Oval region 2210 represents remaining cycling bad blocks. A block that is not a "remaining cycling bad block" is referred to herein as a "remaining cycling pass block." The region outside of oval region 2210 represents the remaining cycling pass blocks. Oval region 2220 represents bad blocks identified by any of the remaining test item conditions, which are referred to as "bad block remaining test item conditions". A block that is not a "bad block remaining test item conditions" is referred to herein as a "pass block remaining test item conditions." The region outside of oval region 2220 represents the pass block remaining test item conditions.

Region A is the region in oval region 2220 but not included in oval region 2210. Region B is the intersection of oval region 2210 and oval region 2220. Region C is the region in oval region 2210 but not included in oval region 2220. Region D are all blocks not in either oval region 2210 or oval region 2220. The following may be stated about these regions:

Region A: bad block remaining test item conditions AND remaining cycling pass block.

Region B: bad block remaining test item conditions AND remaining cycling fail block.

Region C: pass block remaining test item conditions AND remaining cycling fail block.

Region D: pass block remaining test item conditions AND remaining cycling pass block.

FIG. 23 is a diagram illustrating, at a die level, relationships between kill dice identified by a selected candidate test item condition and kill dice identified by remaining candidate test item conditions. A kill die refers to a memory die that had a number of defects exceeding a criterion for the die to not be used. Thus, a kill die results in yield loss. As one example, a kill die may be defined as having a number of bad blocks that exceed a threshold. A kill die may be defined as having a number of bad blocks per plane that exceed a threshold. The kill die could be defined based on some other criterion. Any tested die that is not a kill die is referred to herein as a "pass die."

The rectangle 2300 represents all tested memory dice. Oval region 2310 represents kill dice of the selected test item conditions. A selected test item condition is one that has been selected for inclusion into the production test flow. Oval region 2320 represents kill dice of the remaining test item conditions. A remaining test item condition is one that has not yet been selected for inclusion into the production test flow and has not yet been eliminated.

Region SD is the region in oval region 2320 but not included in oval region 2310. Region SPD is the intersection of oval region 2310 and oval region 2320. Region PD is the region in oval region 2310 but not included in oval region 2320. Region RTD are all memory dice not in either oval region 2310 or oval region 2320. The following may be stated about these regions:

Region PD: kill die induced by selected test item conditions that was NOT kill die by any of the remaining test item conditions.

Region SD: kill die induced by any of the remaining test item conditions that was NOT kill die for any selected test item condition.

Region SPD: selected test item condition kill die AND also a kill die of a remaining test item condition.

Region RTD: selected test item condition pass die AND also a pass die of remaining test item conditions.

With reference to FIGS. 22 and 23, the following definitions may be used in one embodiment of determining a production test flow.

$$\text{Catch ratio} = B/(B+C) \qquad \text{Eq. 4}$$

$$CFD(\text{cycling fail die count}) = B + C \qquad \text{Eq. 5}$$

$$CSFD(\text{cycling fail die count with test item}) = C \qquad \text{Eq. 6}$$

$$TDC = PD + SPD + SD + RTD \qquad \text{Eq. 7}$$

$$\text{Yield loss} = (SD + SPD)/TDC \qquad \text{Eq. 8}$$

$$\text{Cycling yield loss} = CFD/TDC \qquad \text{Eq. 9}$$

$$\text{Extra yield loss} = SD/(SD + RTD) \qquad \text{Eq. 10}$$

$$\text{Initial } DPPM = CFD/(SD + RTD) * 10^6 \qquad \text{Eq. 11}$$

$$DPPM = CSFD/RTD * 10^6 \qquad \text{Eq. 12}$$

$$DPPM \text{ improve} = \text{initial } DPPM - DPPM \qquad \text{Eq. 13}$$

$$\text{Extra yield loss per } 1K \; DPPM \text{ improve} = \qquad \text{Eq. 14}$$

$$\text{Extra yield loss} * 10^3/DPPM \text{ improve}$$

In some embodiments, one or more of calculations in Equations 4 to 14 may be used in process 1100, 1200, and/or 1300. In some embodiments, values such as SPD, PD, B and/or C may be updated during process 1100, 1200, and/or 1300. For example, one or more of Equations 4 to 14 may be used in step 1206 of process 1200 with re-calculations being performed each iteration. One or more of Equations 4 to 14 may be used in step 1312 of process 1300 with re-calculations being performed each iteration.

FIG. 24 is a flowchart of a detailed example of process 2400 of determining a production test flow for testing memory dice. The flow may be similar to process 1300 in FIG. 13.

The process 2400 begins with an input list of test items and test item conditions. Box 2402 represents the list three test items (Test item1, Test item2, Test item3). Boxes 2402 and 2404 each show that there are five conditions for each test item. This is a simplified example. There will typically be many more test items. There may also be more than five conditions for each test item. Furthermore, the test items are not required to each have the same number of test item conditions.

Step 2406 is to calculate a yield loss of each test item condition and to also calculate the cycling yield loss. Step 2408 may be performed separately for each test item condition. Step 2408 includes a determination of whether the yield loss of the test item condition is greater than a yield loss threshold. In this example, condition 1 of test item1 and condition 1 of test item2 are each eliminated (see arrow from 2410) by screen ZZ.

Box 2412 represent the test item conditions that remain after the removal of the test item conditions by screen ZZ. Circle 2414 represents the set of cycling bad blocks. In an embodiment, this set of cycling bad blocks is provided in a user interface (e.g., 1030 in FIG. 10) by a user.

Step 2416 includes a calculation of a catch ratio, a DPPM improvement, an extra yield loss, and an extra yield loss per 1K DDPM improvement. This calculation may be made for each remaining test item condition (see box 2412). For this first iteration the calculation may be made for the full set of cycling bad blocks (see circle 2414). In one embodiment, Equation 4 is used to calculate the catch ratio, equation 13 is used to calculate the DPPM improvement, equation 10 is used to calculate the extra yield loss, and equation 14 is used to calculate the extra yield loss per 1K DDPM improvement.

Step 2418 may be performed for each remaining test item condition (see box 2412). Step 2418 includes a determination of whether the catch ratio is 0. In other embodiments, the catch ratio may be compared to a different catch ratio threshold. In this example, condition 5 of test item1 is eliminated by the catch ratio screen (see screen F01 2420). Note that test item condition have a catch ratio that is too low are eliminated by screen F01.

Step 2422 may be performed for each remaining test item condition (e.g., after both screen ZZ and screen F01). Step 2422 includes a determination of whether the DPPM improvement is less than or equal to zero. In other embodiments, the DPPM improvement may be compared to a different DPPM improvement threshold. In this example, condition 2 of test item2 and condition 1 of test item3 are each eliminated by the DPPM improvement screen (see screen X01 2424).

Step 2426 may be performed for each remaining test item condition (e.g., after screen ZZ, screen F01, and screen X01). Step 2466 may include a search for the test item condition having the lowest extra yield loss per 1K DPPM improvement, which balances yield loss per defect improvement. In this example, condition 5 of test item3 is selected by screen 01 (see screen 01 2428). In this example one test item condition is selected by screen 01; however, more than one test item condition may be selected by screen 01. Screen A01 2430 is used to remove the remaining conditions (conditions 2, 3, 4) of test item3. Therefore, at this point all candidate conditions of test item3 have been removed (see box 2432). The bad blocks that are caught by the selected test item are removed at 2434 (see remove screen 01 catch BB from cycling BB). Therefore, the list of cycling bad blocks will be reduced.

Step 2436 includes a re-calculation of a catch ratio, a DPPM improvement, an extra yield loss, and an extra yield loss per 1K DDPM improvement. This calculation may be made for each remaining test item condition (see box 2432). For this iteration the calculation may be made for the remaining set of cycling bad blocks (see circle 2434). The equations for the calculations may be similar to step 2416.

Step 2438 may be performed for each remaining test item condition (see box 2432). Step 2438 includes a determination of whether the catch ratio is 0. In other embodiments, the catch ratio may be compared to a different catch ratio threshold. In this example, condition 5 of test item2 is eliminated by the catch ratio screen (see screen F02 2440).

Step 2442 may be performed for each remaining test item condition (e.g., after screen F02). Step 2442 includes a determination of whether the DPPM improvement is less than or equal to zero. In other embodiments, the DPPM improvement may be compared to a different DPPM improvement threshold. In this example, condition 4 of test item2 is eliminated by the DPPM improvement screen (see screen X02 2444).

Step 2446 may be performed for each remaining test item condition (e.g., after screen X02). Step 2446 may include a search for the test item condition having the lowest extra yield loss per 1K DPPM improvement. In this example, condition 2 of test item1 is selected by screen 02 (see screen 02 2448). In this example one test item condition is selected by screen 02; however, more than one test item condition may be selected by screen 02. Screen A02 2430 is used to remove the remaining conditions (conditions 3, 4) of test item1. Therefore, at this point all conditions of test item1 have been removed (see box 2454). The bad blocks that are caught by the selected test item are removed at 2452 (see remove screen 02 catch BB from cycling BB). Therefore, the list of cycling bad blocks will be reduced.

Step 2456 includes a re-calculation of a catch ratio, a DPPM improvement, an extra yield loss, and an extra yield loss per 1K DPPM improvement. This calculation may be made for each remaining test item condition (see box 2454). For this iteration the calculation may be made for the remaining set of cycling bad blocks (see circle 2452). The equations for the calculations may be similar to step 2416.

Step 2458 may be performed for each remaining test item condition (see box 2454). Step 2458 includes a determination of whether the catch ratio is 0. In other embodiments, the catch ratio may be compared to a different catch ratio threshold. In this example, condition 3 of test item2 is eliminated by the catch ratio screen (see screen F03 2460). At this point there are no remaining candidate test item conditions. For the sake of discussion, step 2462 may be performed if there are any remaining test item condition (e.g., after screen F03). If there are any remaining test item condition (e.g., after screen X03 2464), then step 2466 may be made, which could select another test item condition for the production test flow (see Screen 03 2468). Box 2470 shows that there are no more candidate test item conditions. Therefore, the process ends.

Figure 25:
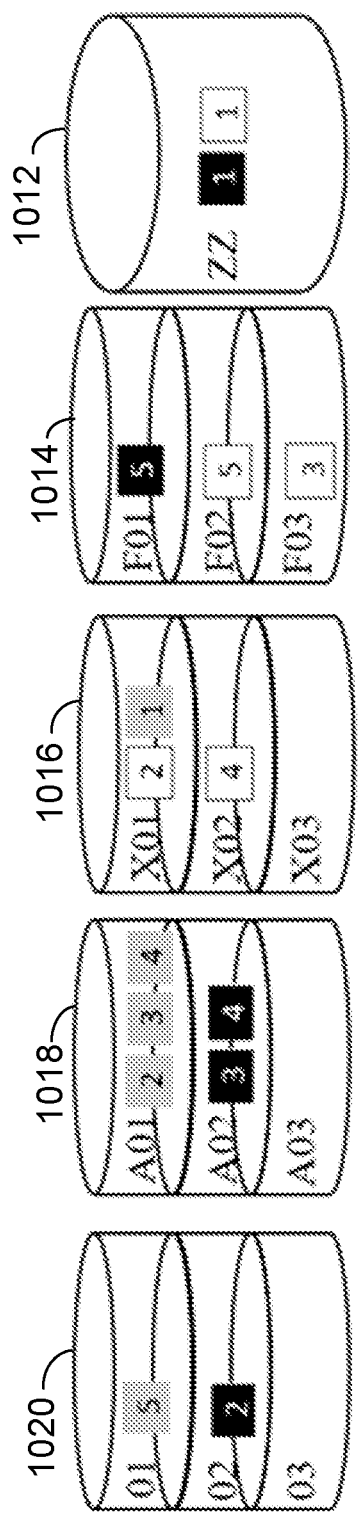
FIG. 25 shows results for the example in FIG. 24.

FIG. 25 shows results for the example in FIG. 24. Category ZZ 1012 contains the test item conditions removed by Screen ZZ. Category Fn 1014 contains the test item conditions removed by the three iterations of screen Fn Category Xn 1016 contains the test item conditions removed by the iterations of screen Xn. Category An 1018 contains the test item conditions removed by the iterations of screen An. Category Sn 1020 contains the test item conditions selected by the iterations of screen Sn.

Figure 26:
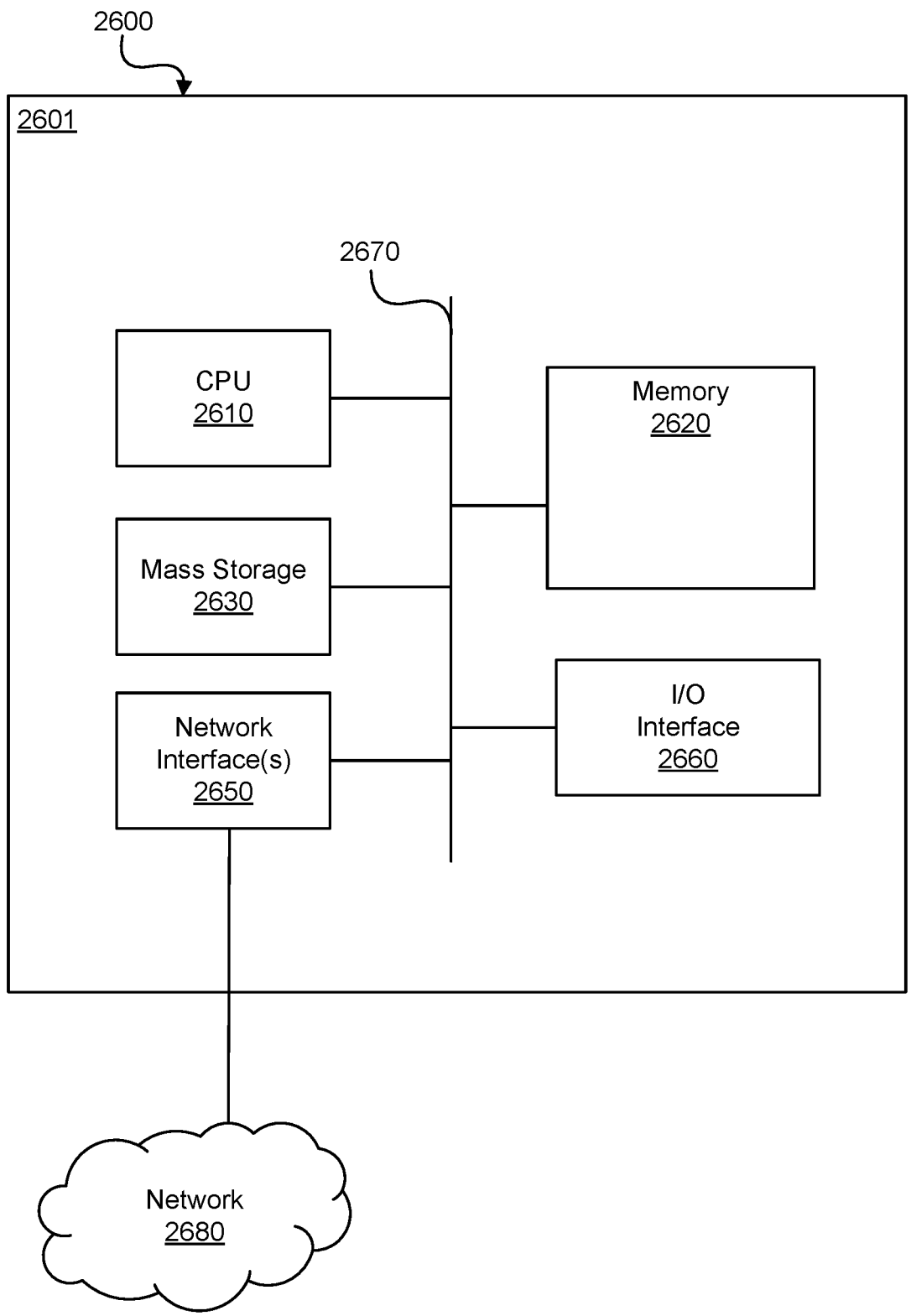
FIG. 26 is a high-level block diagram of a computing system that can be used to implement various embodiments of determining a production phase test flow for testing memory dice.

FIG. 26 is a high-level block diagram of a computing system 2600 that can be used to implement various embodiments of determining a production phase test flow for testing memory dice. Specific devices may utilize all of the components shown, or only a subset of the components, and levels of integration may vary from device to device. Furthermore, a device may contain multiple instances of a component, such as multiple processing units, processors, memories, transmitters, receivers, etc.

The computing system may comprise a processing unit 2601 equipped with one or more input/output devices, such as network interfaces, storage interfaces, and the like. The processing unit 2601 may include a central processing unit (CPU) 2610, a memory 2620, a mass storage device 2630, and an I/O interface 2660 connected to a bus 2670. The bus may be one or more of any type of several bus architectures including a memory bus or memory controller, a peripheral bus or the like.

The CPU 2610 may comprise any type of electronic data processor. The CPU 2610 may be configured to implement any of the process flows (e.g., process 1100, 1200, 1300, and/or 2400) described herein, using any one or combination of steps described in the embodiments. The memory 2620 may comprise any type of system memory such as static random access memory (SRAM), dynamic random access memory (DRAM), synchronous DRAM (SDRAM), read-only memory (ROM), a combination thereof, or the like. In an embodiment, the memory 2620 may include ROM for use at boot-up, and DRAM for program and data storage for use while executing programs. In embodiments, the memory 2620 is non-transitory.

The mass storage device 2630 may comprise any type of storage device configured to store data, programs, and other information and to make the data, programs, and other information accessible via the bus. The mass storage device 2630 may comprise, for example, one or more of a solid state drive, hard disk drive, a magnetic disk drive, an optical disk drive, or the like.

The processing unit 2601 also includes one or more network interfaces 2650, which may comprise wired links, such as an Ethernet cable or the like, and/or wireless links to access nodes or one or more networks 2680. The network interface 2650 allows the processing unit 2601 to communicate with remote units via the network 2680. For example, the network interface 2650 may provide wireless communication via one or more transmitters/transmit antennas and one or more receivers/receive antennas. In an embodiment, the processing unit 2601 is coupled to a local-area network or a wide-area network for data processing and communications with remote devices, such as other processing units, the Internet, remote storage facilities, or the like.

The components depicted in the computing system of FIG. 26 are those typically found in computing systems suitable for use with the technology described herein, and are intended to represent a broad category of such computer components that are well known in the art. Many different bus configurations, network platforms, and operating systems can be used.

The technology described herein can be implemented using hardware, software, or a combination of both hardware and software. The software used is stored on one or more of the processor readable storage devices described above to program one or more of the processors to perform the functions described herein. The processor readable storage devices can include computer readable storage media such as volatile and non-volatile media, removable and non-removable media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

One embodiment includes a computer readable storage medium having stored thereon computer readable instructions that, when executed on a processor, cause the processor to access test items with a plurality of candidate test item conditions for each test items. Test items are tests performed on memory dice having memory cells to determine defects. The candidate test item conditions for each respective test item are candidate pass/fail criteria for the respective test item. The instructions also cause the processor to access a list of defects in a group of memory dice, if any, detected by each respective candidate test item condition. The instructions also cause the processor to access a list of benchmark defects in the group of memory dice. The instructions also cause the processor to compare the defects detected by the respective candidate test item conditions with the benchmark defects in view of judgement criteria. The instructions also cause the processor to eliminate at least one test item based on the comparison resulting in a set of remaining test items. The instructions also cause the processor to generate a production phase test flow having a test item condition for each remaining test item, the generating based on the comparing.

In a further embodiment, the instructions that cause the processor to generate the production phase test flow further cause the processor to eliminate candidate test item conditions based on a plurality of categories including a yield loss category, a catch ratio category, and a defective part improvement category.

In a further embodiment, the computer readable storage medium further comprises instructions that cause the processor to: for each eliminated candidate test item condition, output the category by which the candidate test item condition was eliminated.

In a further embodiment, the instructions that cause the processor to generate the production phase test flow further cause the processor to select candidate test item conditions for inclusion in the production phase test flow based on balancing extra yield loss induced by the candidate test item condition per defective part detection improvement made by the candidate test item condition.

In a further embodiment, the instructions further cause the processor to remove benchmark defects detected by candidate test item conditions selected for the production phase test flow from the benchmark defect list. The instructions that cause the processor to compare the defects detected by the candidate test item conditions with the benchmark defects in view of the judgement criteria further cause the processor to compare the defects detected by the respective remaining candidate test item conditions with the remaining benchmark defects in view of the judgement criteria.

In a further embodiment, the computer readable storage medium further comprises instructions that cause the processor to: estimate a defective part count after testing memory dice in the production phase with the production phase test flow; and output the estimated defective part count in a user interface. The defective part count based on parts that passed testing failing a usage criterion.

In a further embodiment, the computer readable storage medium further comprises instructions that cause the processor to: estimate a yield loss for testing memory dice in the production phase with the production phase test flow; and output the estimated yield loss in a user interface.

In a further embodiment, the instructions that cause the processor to generate the production phase test flow further cause the processor to: repeat the following until all candidate test item conditions have been either eliminated or selected for the production phase test flow: 1) compare the defects detected by any remaining candidate test item conditions with any remaining benchmark defects in view of the judgement criteria; 2) eliminate one or more candidate test item conditions from inclusion in the production phase test flow based on the comparison resulting in a latest round of remaining candidate test item conditions; 3) select at least one test item condition for inclusion in the production phase test flow based on the comparison, the at least one test item condition selected from test items from the latest round of remaining candidate test item conditions; 4) eliminate any remaining candidate test item conditions for each test item that corresponds to the at least one selected test item condition; and 5) remove any benchmark defects detected by the selected test item condition.

In a further embodiment, the judgement criteria include a yield loss threshold. The instructions that cause the processor to generate the production phase test flow further cause the processor to: determine a yield loss threshold for candidate test item conditions based on a comparison of defects detected by the candidate test item conditions with the benchmark defects; and eliminate candidate test item conditions that result in a yield loss that exceeds the yield loss threshold.

In a further embodiment, the judgement criteria include a catch ratio threshold. The instructions that cause the processor to generate the production phase test flow further cause the processor to: determine a catch ratio for candidate test item conditions based on a comparison of defects detected by the candidate test item conditions with defects that remain in the benchmark defects after removing defects detected by test item conditions that have presently been selected for the production phase test flow; and eliminate candidate test item conditions that result in a catch ratio that is less than or equal to the catch ratio threshold.

In a further embodiment, the judgement criteria include a defective part count improvement threshold. The instructions that cause the processor to generate the production phase test flow further cause the processor to: determine a defective part count improvement threshold for candidate test item conditions based on a comparison of defects detected by the candidate test item conditions with the benchmark defects after removing defects detected by test item condition that have presently been selected for the production phase test flow; and eliminate candidate test item conditions that result in a defective part count improvement that is less than or equal to the defective part count improvement threshold.

In a further embodiment, the judgement criteria include an extra yield loss per defective part count improvement. The instructions that cause the processor to generate the production phase test flow further cause the processor to: eliminate one or more candidate test item conditions for use during the production phase based on the comparison resulting in remaining candidate test item conditions; select at least one test item condition from the remaining candidate test item conditions based on the comparison, including: determine an extra yield loss per defective part count improvement for each of the remaining candidate test item conditions; and select a candidate test item condition of the remaining candidate test item conditions having a best extra yield loss per defective part count improvement; and eliminate any remaining test item conditions for each test item that corresponds to the selected at least one test item condition.

An embodiment includes a method for determining a production test flow for testing memory dice. The method comprises receiving candidate test items with a plurality of candidate test item conditions for each test item in a user interface, wherein test items are tests performed on memory dice and the candidate test item conditions for each respective test items are candidate pass/fail criteria for the respective test item; receiving a list of bad blocks in a group of memory dice in the user interface, if any, for each test item condition; receiving a list of cycling bad blocks in the group of memory dice in the user interface; receiving judgement criteria in the user interface; repeating the following until all candidate test item conditions have been either eliminated or selected for a production phase test flow: comparing the bad blocks for any remaining candidate test item conditions with any remaining cycling bad blocks in view of the judgement criteria; eliminating one or more candidate test item conditions for use during a production phase based on the comparing resulting in a latest round of remaining candidate test item conditions; selecting a test item condition for each of one or more test items from the latest round of remaining candidate test item conditions based on the comparing; and eliminating any remaining candidate test item conditions for each test item that corresponds to the selected test item condition; and removing any cycling bad blocks caught by the selected test item condition. The production test flow is output in the user interface.

An embodiment includes a computer system, comprising a user interface and a processor in communication with the user interface. The processor is configured to receive in the user interface: judgement criteria that comprise a selection criterion and multiple elimination criteria; candidate test items with a plurality of candidate test item conditions for each test item in a user interface, wherein test items are tests performed on memory dice to determine defects and the candidate test item conditions for each respective test item are candidate pass/fail criteria for the respective test item; a list of bad blocks in a group of memory dice in the user interface, if any, for each candidate test item condition; a usage list of bad blocks in the group of memory dice in the user interface, the usage list being bad blocks after use of the memory dice for a usage criterion. The processor is configured to: eliminate candidate test item conditions based a comparison of the list of bad blocks for candidate test item conditions with the usage list of bad blocks in view of the multiple elimination criteria to result in remaining candidate test item conditions; select among the remaining candidate test item conditions based on a comparison of the list of bad blocks for the remaining candidate test item conditions with the usage list of bad blocks in view of the selection criterion to result in final test item conditions; and output the final test item conditions in the user interface.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A computer readable medium having stored thereon computer readable instructions that, when executed on a processor, cause the processor to:
   access test items with a plurality of candidate test item conditions for each test item, wherein test items are tests performed on memory dice having memory cells to determine defects, wherein the candidate test item conditions for each respective test item are candidate pass/fail criteria for the respective test item;
   access a list of defects in a group of memory dice, if any, detected by each respective candidate test item condition;
   access a judgement criterion for each of a plurality of categories, each judgement criterion having a threshold, including:
      receive, in a user interface, a yield loss threshold for a yield loss judgement criterion for a yield loss category:
   access a list of benchmark defects in the group of memory dice;
   compare the defects detected by the respective candidate test item conditions with the benchmark defects in view of the judgement criterion for each category of the plurality of categories, including calculate a metric for each category and compare each metric with the threshold for the judgement criterion for the associated category;
   eliminate at least one test item based on the comparison resulting in a set of remaining test items, including eliminate the at least one test item for which the metric for a first category of the categories fails to meet the associated threshold, including eliminate at least one test item condition for which the metric for the yield loss category fails to meet the yield loss threshold for the yield loss judgement criterion for the yield loss category; and
   generate a production phase test flow having a test item condition for each remaining test item, the generating based on the comparison.

2. The computer readable medium of claim 1, wherein the plurality of categories include the yield loss category, a catch ratio category, and a defective part improvement category.

3. The computer readable medium of claim 2, further comprising instructions that cause the processor to:
   for each eliminated candidate test item condition, output the category by which the candidate test item condition was eliminated.

4. The computer readable medium of claim 2, wherein the instructions that cause the processor to generate the production phase test flow further cause the processor to:
   select candidate test item conditions for inclusion in the production phase test flow based on balancing extra yield loss induced by the candidate test item condition per defective part detection improvement made by the candidate test item condition.

5. The computer readable medium of claim 4, wherein:
   the instructions further cause the processor to remove benchmark defects detected by candidate test item conditions selected for the production phase test flow from the benchmark defect list; and
   the instructions that cause the processor to compare the defects detected by the candidate test item conditions with the benchmark defects in view of the judgement criteria further cause the processor to compare the defects detected by the respective remaining candidate test item conditions with the remaining benchmark defects in view of the judgement criteria.

6. The computer readable medium of claim 1, further comprising instructions that cause the processor to:
   estimate a defective part count for the production phase test flow, the defective part count based on a difference between parts that failed a cycling test and parts detected as failed by the test items in the production phase test flow, the parts that failed the cycling test being the list of benchmark defects; and
   output the estimated defective part count in an output interface.

7. The computer readable medium of claim 1, further comprising instructions that cause the processor to:
   estimate a yield loss for the production phase test flow; and
   output the estimated yield loss in an output interface.

8. The computer readable medium of claim 1, wherein the instructions that cause the processor to generate the production phase test flow further cause the processor to:
   repeat the following until all candidate test item conditions have been either eliminated or selected for the production phase test flow:
      compare the defects detected by any remaining candidate test item conditions with any remaining benchmark defects in view of the judgement criteria;
      eliminate one or more candidate test item conditions from inclusion in the production phase test flow based on the comparison resulting in a latest round of remaining candidate test item conditions;
      select at least one test item condition for inclusion in the production phase test flow based on the comparison, the at least one test item condition selected from test items from the latest round of remaining candidate test item conditions;

eliminate any remaining candidate test item conditions for each test item that corresponds to the at least one selected test item condition; and remove any benchmark defects detected by the selected at least one test item condition.

9. The computer readable medium of claim 1, wherein:
the plurality of categories include a catch ratio category;
the instructions further cause the processor to receive, in the user interface, a catch ratio threshold for a catch ratio judgement criterion for the catch ratio category; and
the instructions that cause the processor to eliminate at least one test item further cause the processor to:
determine a catch ratio for candidate test item conditions based on a comparison of defects detected by the candidate test item conditions with defects that remain in the benchmark defects after removing defects detected by test item conditions that have presently been selected for the production phase test flow; and
eliminate candidate test item conditions that result in a catch ratio that is less than or equal to the catch ratio threshold.

10. The computer readable medium of claim 1, wherein:
the plurality of categories include a defective part count improvement category;
the instructions further cause the processor to receive, in the user interface, a defective part count improvement threshold for a defective part count improvement criterion for the defective part count improvement category; and
the instructions that cause the processor to eliminate at least one test item further cause the processor to:
determine a defective part count improvement for candidate test item conditions based on a comparison of defects detected by the candidate test item conditions with the benchmark defects after removing defects detected by test item condition that have presently been selected for the production phase test flow; and
eliminate candidate test item conditions that result in a defective part count improvement that is less than or equal to the defective part count improvement threshold.

11. The computer readable medium of claim 1, wherein:
the plurality of categories include an extra yield loss per defective part count improvement category; and
the instructions that cause the processor to eliminate at least one test item based on the comparison further cause the processor to:
eliminate one or more candidate test item conditions for the production phase test flow based on the comparison resulting in remaining candidate test item conditions;
select at least one test item condition from the remaining candidate test item conditions based on the comparison, including:
determine an extra yield loss per defective part count improvement for each of the remaining candidate test item conditions;
select a candidate test item condition of the remaining candidate test item conditions having a best extra yield loss per defective part count improvement; and
eliminate any remaining test item conditions for each test item that corresponds to the selected at least one test item condition.

12. A computer implemented method for determining a production test flow for testing memory dice, the method comprising:
receiving candidate test items with a plurality of candidate test item conditions for each test item in a user interface, wherein test items are tests performed on memory dice and the candidate test item conditions for each respective test item are candidate pass/fail criteria for the respective test item;
receiving a list of bad blocks in a group of memory dice in the user interface, if any, for each test item condition, the list of bad blocks for each test item condition being blocks that were detected as defective based on the test item condition;
receiving a list of cycling bad blocks in the group of memory dice in the user interface, the list of cycling bad blocks being blocks that failed after a cycling test of the group of memory dice;
receiving thresholds for associated judgement criteria in the user interface, the judgement criteria associated with categories;
repeating the following i) through v) until all candidate test item conditions have been either eliminated or selected for a production phase test flow:
i) comparing the bad blocks for any remaining candidate test item conditions with any remaining cycling bad blocks based on the judgement criteria, including: calculating a metric for each category, and comparing each metric with the threshold for the judgement criteria associated with the category;
ii) eliminating one or more candidate test item conditions for use during a production phase based on the comparing resulting in a latest round of remaining candidate test item conditions, including eliminating one or more candidate test item conditions for which at least one of the categories fails to meet the associated threshold, wherein at least one performance of eliminating one or more candidate test item conditions removes all remaining candidate test item conditions for a particular candidate test item;
iii) selecting at least one test item condition from the latest round of the remaining candidate test item conditions based on the comparing;
iv) eliminating any remaining candidate test item conditions for the at least one selected test item condition; and
v) removing any cycling bad blocks caught by the at least one selected test item condition; and
outputting the production test flow in the user interface.

13. The computer implemented method of claim 12, further comprising eliminating all of the candidate test item conditions for at least one of the candidate test items from the production phase test flow.

14. A computer system, comprising:
a user interface; and
a processor in communication with the user interface, the processor configured to:
i) receive in the user interface:
thresholds for associated judgement criteria;
candidate test items with a plurality of candidate test item conditions for each test item in a user interface, wherein test items are tests performed on memory dice to determine defects and the candidate test item conditions for each respective test item are candidate pass/fail criteria for the respective test item;
a list of bad blocks in a group of memory dice in the user interface, if any, for each candidate test item condition, the list of bad blocks for each test item condition being blocks that were detected as defective based on the test item condition; and
a usage list of bad blocks in the group of memory dice in the user interface, the usage list being bad blocks after use of the memory dice for a usage criterion;
ii) eliminate candidate test item conditions based on a comparison of the list of bad blocks for candidate test item conditions with the usage list of bad blocks based on of the judgement multiple elimination criteria to result in remaining candidate test item conditions, including:
calculate a metric for each judgement criteria;
compare each metric with an associated threshold for the judgement criteria; and
eliminate the candidate test item conditions for which at least one of the judgement criteria fails to meet the associated threshold, wherein at least one performance of eliminating candidate test item conditions removes all remaining candidate test item conditions for a particular candidate test item;
iii) select a test item condition from among the remaining candidate test item conditions based on a comparison of the list of bad blocks for the remaining candidate test item conditions with the usage list of bad blocks based on a selection criterion;
iv) remove blocks from the usage list of bad blocks that are caught by the selected test item condition;
v) repeat said ii, iii, and iv until there are no more remaining candidate test item conditions to result in final selected test item conditions; and
vi) output the final selected test item conditions in the user interface.

15. The computer system of claim 14, wherein:
the selection criterion includes an extra yield loss per defective part count improvement; and
to select among the remaining candidate test item conditions the processor is further configured to:
determine an extra yield loss per defective part count improvement for each of the remaining candidate test item conditions; and
select a candidate test item condition of the remaining candidate test item conditions having a best extra yield loss per defective part count improvement.

16. The computer system of claim 14, wherein:
the thresholds for the associated judgement criteria include a yield loss threshold; and
the processor is further configured to:
determine a yield loss for candidate test item conditions based on a comparison of bad blocks for the candidate test item conditions with the usage bad blocks; and
eliminate candidate test item conditions that result in a yield loss that exceeds the yield loss threshold.

17. The computer system of claim 14, wherein:
the thresholds for the associated judgement criteria include a catch ratio threshold; and
the processor is further configured to:
determine a catch ratio for remaining candidate test item conditions based on a comparison of bad blocks for the remaining candidate test item conditions with bad blocks that remain on the usage list of bad blocks after selecting test item conditions for inclusion in the final test item conditions; and
eliminate remaining candidate test item conditions that result in a catch ratio that is less than or equal to the catch ratio threshold.

18. The computer system of claim 14, wherein:
the thresholds for the associated judgement criteria include defective part count improvement threshold; and
the processor is further configured to:
determine a defective part count improvement for remaining candidate test item conditions based on a comparison of bad blocks for the remaining candidate test item conditions with bad blocks that remain on the usage list of bad blocks after selecting test item conditions for including on the final test item conditions; and
eliminate candidate test item conditions that result in a defective part count improvement that is less than or equal to the defective part count improvement threshold.

* * * * *